(12) United States Patent
Hirono et al.

(10) Patent No.: US 10,892,395 B2
(45) Date of Patent: Jan. 12, 2021

(54) THERMOELECTRIC CONVERSION MATERIAL AND PRODUCTION METHOD THEREOF

(71) Applicant: TOYOTA JIDOSHA KABUSHIKI KAISHA, Toyota (JP)

(72) Inventors: Shinsuke Hirono, Numazu (JP); Hiroyuki Suto, Numazu (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 197 days.

(21) Appl. No.: 15/936,658

(22) Filed: Mar. 27, 2018

(65) Prior Publication Data

US 2018/0287033 A1 Oct. 4, 2018

(30) Foreign Application Priority Data

Mar. 31, 2017 (JP) .................................. 2017-072818

(51) Int. Cl.
*H01L 35/18* (2006.01)
*H01L 35/28* (2006.01)
(Continued)

(52) U.S. Cl.
CPC .............. *H01L 35/18* (2013.01); *H01L 35/22* (2013.01); *H01L 35/28* (2013.01); *H01L 35/34* (2013.01)

(58) Field of Classification Search
CPC ......... H01L 35/18; H01L 35/22; H01L 35/28; H01L 35/34
(Continued)

(56) References Cited

U.S. PATENT DOCUMENTS 3,564,860 A * 2/1971 Reich et al. ............ H01L 35/26
62/3.7
2008/0289677 A1* 11/2008 Bell ....................... H01L 35/26
136/236.1
(Continued)

FOREIGN PATENT DOCUMENTS

JP 04334832 A 11/1992
JP 2007-146283 A 6/2007
(Continued)

OTHER PUBLICATIONS

Vivès, Solange, et al. "Combinatorial Approach Based on Interdiffusion Experiments for the Design of Thermoelectrics: Application to the Mg2(Si,Sn) Alloys." Chemistry of Materials, vol. 26, No. 15, 2014, pp. 4334-4337., doi:10.1021/cm502413t. (Year: 2014).*
(Continued)

*Primary Examiner* — Magali P Slawski
*Assistant Examiner* — Kourtney R S Carlson
(74) *Attorney, Agent, or Firm* — Sughrue Mion, PLLC

(57) ABSTRACT

To provide a thermoelectric conversion material having an enhanced thermoelectromotive force and a production method thereof. A thermoelectric conversion material including a matrix and a barrier material, wherein the matrix contains $Mg_2Si_{1-x}Sn_x$ (x is from 0.50 to 0.80) and an n-type dopant and the barrier material contains $Mg_2Si_{1-y}Sn_y$ (y is from 0 to 0.30), and a production method thereof. A thermoelectric conversion material and a production method thereof, in which the movement of minority carrier is blocked by a barrier material and the thermoelectromotive force is thereby enhanced, can be provided.

21 Claims, 14 Drawing Sheets

(51) Int. Cl.
*H01L 35/34* (2006.01)
*H01L 35/22* (2006.01)

(58) Field of Classification Search
USPC .................................... 136/200–220, 240
See application file for complete search history.

(56) References Cited

U.S. PATENT DOCUMENTS

| | | |
|---|---|---|
| 2008/0295879 A1 | 12/2008 | Atanackovic |
| 2012/0118343 A1 | 5/2012 | Iida et al. |
| 2015/0171304 A1* | 6/2015 | Ballinger ............... H01L 35/16 136/200 |
| 2017/0306445 A1 | 10/2017 | Yamamoto et al. |

FOREIGN PATENT DOCUMENTS

| | | |
|---|---|---|
| JP | 2009-68090 A | 4/2009 |
| JP | 2010-65245 A | 3/2010 |
| JP | 2011-49538 A | 3/2011 |
| JP | 2012-190984 A | 10/2012 |
| JP | 2015-110820 A | 6/2015 |

OTHER PUBLICATIONS

K. Yin et al., "In situ nanostructure design leading to a high figure of merit in an eco-friendly stable $Mg_2Si_{0.30}Sn_{0.70}$ solid solution", RSC Advances, 6, (2016), pp. 16824-16831, 8 pages total.

W. Liu et al., "Enhanced thermoelectric properties of n-type $Mg_{2.16}$ $(Si_{0.4}Sn_{0.6})_{1-y}Sb_y$ due to nano-sized Sn-rich precipitates and an optimized electron concentration", J. Mater.Chem., 22, (2012), pp. 13653-13661, 9 pages total.

D.A. Pshenai-Severin et al., "The influence of grain boundary scattering on thermoelectric properties of $Mg_2Si$ and $Mg_2Si_{0.8}$ $Sn_{0.2}$", J. Electron. Mater., 42, (2013), pp. 1707-1710, 4 pages total.

Communication dated Dec. 10, 2019 by the USPTO in U.S. Appl. No. 15/439,004.

Wei Liu et al., "Convergence of Conduction Bands as a Means of Enhancing Thermoelectric Performance of n-Type $Mg_2Si_{1-x}Sn_x$ Solid Solutions", Physical Review Letters, Apr. 20, 2012, pp. 166601-1-166601-5, vol. 108.

Communication dated Jan. 30, 2019 by the USPTO in U.S. Appl. No. 15/439,004.

Muthiah et al., "Double-Doping Approach to Enhancing the Thermoelectric Figure-of-Merit of n-Type $Mg_2Si$ Synthesized by Use of Spark Plasma Sintering", Journal of Electronic Materials, vol. 43, No. 6, 2014, pp. 2035-2039.

Liu et al., "Low-temperature solid state reaction synthesis and thermoelectric properties of high-performance and low-cost Sb-doped $Mg_2Si_{0.6}Sn_{0.4}$", Journal of Physics D: Applied Physics, vol. 43, 2010, pp. 1-6 (7 pages).

Gao et al., "Transport and Mechanical Properties of High-ZT $Mg_{2.08}Si_{0.4-x}Sn_{0.6}Sb_x$ Thermoelectric Materials", Journal of Electronic Materials. vol. 43, No. 6, 2014, pp. 1790-1803.

Communication dated Feb. 21, 2020 by the USPTO in U.S. Appl. No. 15/439,004.

Communication dated Aug. 28, 2019 by the USPTO in U.S. Appl. No. 15/439,004.

* cited by examiner

SOURCE Wei Liu, et al., Physical Review Letters, 108, 166601, (2012)

1

THERMOELECTRIC CONVERSION MATERIAL AND PRODUCTION METHOD THEREOF

TECHNICAL FIELD

The present disclosure relates to a thermoelectric conversion material and a production method thereof. More specifically, the present disclosure relates to a thermoelectric conversion material and a production method thereof, in which the thermoelectromotive force is enhanced by reducing the effect of minority carrier.

BACKGROUND ART

In order to effectively utilize heat discharged from factories, automobiles, electronic equipment, etc., a thermoelectric conversion material for converting heat energy to electric energy is attracting attention.

However, the thermoelectric conversion material generally has low conversion efficiency, and therefore attempts are being made to enhance the conversion efficiency of the thermoelectric conversion material.

For example, Patent Document 1 discloses a technique for inexpensively producing a nanocomposite thermoelectric conversion material by using a raw material powder having a large particle diameter.

Specifically, Patent Document 1 discloses a nanocomposite thermoelectric conversion material of $Mg_2X_{1-\alpha}Y_\alpha$, $Mg_2Y_{1-\beta}X_\beta$, and X (wherein each of X and Y is one of Si, Ge, Sn and Pb, and X and Y are different). In Patent Document 1, it is disclosed that both $\alpha$ and $\beta$ are from 0 to 0.1. Furthermore, in Patent Document 1, all of respective sizes of $Mg_2X_{1-\alpha}Y_\alpha$, $Mg_2Y_{1-\beta}X_\beta$ and X are disclosed as 500 nm or less.

RELATED ART

Patent Document

[Patent Document 1] Japanese Unexamined Patent Publication No. 2015-110820

SUMMARY OF THE INVENTION

Problems to be Solved by the Invention

Out of thermoelectric conversion materials disclosed in Patent Document 1, the followings can hold true for most representative thermoelectric conversion materials where X and Y are respectively Si and Sn, i.e., for $Mg_2Si_{1-\alpha}Sn_\alpha$, $Mg_2Sn_{1-\beta}Si_\beta$ and Si.

When both $\alpha$ and $\beta$ are from 0 to 0.1, the thermoelectromotive force inherently possessed by $Mg_2Si_{1-\alpha}Sn_\alpha$ and $Mg_2Sn_{1-\beta}Si_\beta$ is low. In addition, with Si alone, the thermoelectromotive force is low. Accordingly, even when a nanocomposite thermoelectric conversion material is produced using these materials, it is difficult to obtain high thermoelectromotive force.

For this reason, the present inventors have found that the problem to be solved is enhancement of the thermoelectromotive force of the thermoelectric conversion material.

The present invention has been made to solve the problem above. More specifically, an object of the present disclosure is to provide a thermoelectric conversion material having an enhanced thermoelectromotive force and a production method thereof.

Means to Solve the Problems

The present inventors have made many intensive studies to attain the object above and have accomplished the thermoelectric conversion material of the present disclosure and the production method thereof. The gist thereof is as follows.

<1> A thermoelectric conversion material comprising a matrix and a barrier material, wherein:
the matrix contains $Mg_2Si_{1-x}Sn_x$ (x is from 0.50 to 0.80) and an n-type dopant, and
the barrier material contains $Mg_2Si_{1-y}Sn_y$ (y is from 0 to 0.30).

<2> The thermoelectric conversion material according to item <1>, wherein the n-type dopant is one or more members selected from Sb, Bi and Al.

<3> The thermoelectric conversion material according to item <1> or <2>, wherein at least part of the barrier material is present in a grain boundary of the matrix.

<4> The thermoelectric conversion material according to any one of items <1> to <3>, wherein at least part of the barrier material is dispersed in the matrix.

<5> The thermoelectric conversion material according to item <3> or <4>, comprising from 5 to 20 vol % of the barrier material relative to the entire thermoelectric conversion material.

<6> The thermoelectric conversion material according to any one of items <3> to <5>, wherein:
the thermoelectric conversion material further comprises an intermediate material, and
the intermediate material contains $Mg_2Si_{1-z}Sn_z$ (z is more than 0.30 and less than 0.50).

<7> The thermoelectric conversion material according to item <6>, wherein at least part of the intermediate material is present in a grain boundary of the matrix.

<8> The thermoelectric conversion material according to item <6> or <7>, wherein at least part of the intermediate material is dispersed in the matrix.

<9> The thermoelectric conversion material according to item <1> or <2>, wherein:
the barrier material and the matrix are stacked to sandwich the barrier material between the matrices, and
the barrier material is formed as one layer or as two or more layers.

<10> The thermoelectric conversion material according to item <9>, wherein:
one end in the stacking direction of the thermoelectric conversion material is a high temperature side,
another end in the stacking direction of the thermoelectric conversion material is a low temperature side, and
when the thermoelectric conversion material is divided into four equal parts in the stacking direction, at least one layer of the barrier material is formed in the second equal part from the high temperature side.

<11> The thermoelectric conversion material according to item <9> or <10>, wherein:
an intermediate material is further stacked between the matrix and at least one layer of the barrier material, and
the intermediate material contains $Mg_2Si_{1-z}Sn_z$ (z is more than 0.30 and less than 0.50).

<12> A method for producing the thermoelectric conversion material according to item <1>, comprising:
after weighing raw materials containing Mg, Si, Sn and an n-type dopant, subjecting them to first alloying heat treatment to obtain a matrix alloy ingot,
after weighing raw materials containing Mg, Si and Sn, subjecting them to second alloying heat treatment to obtain a barrier material alloy ingot, crushing the matrix alloy ingot to obtain a matrix alloy powder, crushing the barrier material alloy ingot to obtain a barrier material alloy powder, obtaining a green compact containing the matrix alloy powder and the barrier material alloy powder, and sintering the green compact to obtain a sintered body, wherein:

the matrix alloy ingot contains $Mg_2Si_{1-x}Sn_x$ (x is from 0.50 to 0.80) and an n-type dopant, and the barrier material alloy ingot contains $Mg_2Si_{1-y}Sn_y$ (y is from 0 to 0.30).

<13> The method according to item <12>, wherein the n-type dopant is one or more members selected from Sb, Bi and Al.

<14> The method according to item <12> or <13>, wherein the temperature of the first alloying heat treatment is from 600 to 750° C.

<15> The method according to any one of items <12> to <14>, wherein the temperature of the second alloying heat treatment is from 800 to 950° C.

<16> The method according to any one of items <12> to <15>, comprising:

mixing the matrix alloy powder and the barrier material alloy powder to obtain a mixed powder, and compacting the mixed powder to obtain a green compact.

<17> The method according to item <16>, wherein the portion occupied by the barrier material alloy powder accounts for 5 to 20 vol % relative to the entire volume of the green compact.

<18> The method according to item <16> or <17>, comprising:

after weighing raw materials containing Mg, Si and Sn, subjecting them to third alloying heat treatment to obtain an intermediate material alloy ingot, crushing the intermediate material alloy ingot to obtain an intermediate material alloy powder, mixing the matrix alloy powder, the barrier material alloy powder, and the intermediate material alloy powder to obtain a mixed powder, and compacting the mixed powder to obtain a green compact, wherein:

the intermediate material alloy ingot contains $Mg_2Si_{1-z}Sn_z$ (z is more than 0.30 and less than 0.50).

<19> The method according to any one of items <12> to <15>, comprising:

depositing the matrix alloy powder to form a matrix alloy powder layer, depositing the barrier material alloy powder to form a barrier material alloy powder layer, stacking the matrix alloy powder layer and the barrier material alloy powder layer while sandwiching the barrier material alloy powder layer by the matrix alloy powder layers to obtain a powder stack having one layer or two or more layers of the barrier material alloy powder layer, and compacting the powder stack to obtain a green compact.

<20> The method according to item <19>, wherein the powder stack is obtained by stacking the matrix alloy powder layer and the barrier material alloy powder layer such that when the stacking length of the powder stack is divided into four equal parts, at least one barrier material alloy powder layer is present in the second equal part from one end of the powder stack.

<21> The method according to item <19> or <20>, comprising:

after weighing raw material powders containing Mg, Si and Sn, subjecting them to third alloying heat treatment to obtain an intermediate material alloy ingot, crushing the intermediate material alloy ingot to obtain an intermediate material alloy powder, depositing the intermediate material alloy powder to form an intermediate material alloy powder layer, and further stacking the intermediate material alloy powder layer between the matrix alloy powder layer and the barrier material alloy powder layer to obtain a powder stack.

Effects of the Invention

According to the present disclosure, the matrix contains $Mg_2Si_{1-x}Sn_x$ (x is from 0.50 to 0.80) and an n-type dopant, and the barrier material contains $Mg_2Si_{1-y}Sn_y$ (y is from 0 to 0.30), so that the movement of minority carrier (hole) can be blocked by the barrier material. As a result, according to the present disclosure, a thermoelectric conversion material having an enhanced thermoelectromotive force can be provided.

In addition, according to the present disclosure, a production method of a thermoelectric conversion material in which the thermoelectromotive force is enhanced by reducing the effect of minority carrier (hole), can be provided.

EMBODIMENT FOR CARRYING OUT THE INVENTION

With respect to the thermoelectric conversion material of the present disclosure and the production method thereof, their embodiments are described in detail below. However, the embodiments described below should not be construed as limiting the thermoelectric conversion material of the present disclosure and the production method thereof.

The thermoelectric conversion material generates power due to a temperature difference produced between both ends thereof. When a temperature difference is produced between both ends of the thermoelectric conversion material, the following phenomenon occurs.

In the case where the thermoelectric conversion material is formed of an n-type semiconductor, many electrons transfer from a high temperature side to a low temperature side, and consequently a current flows from the low temperature side to the high temperature side. On the other hand, when the thermoelectric conversion material is formed of a p-type semiconductor, many holes transfer from the high temperature side to the low temperature side, and consequently a current flows from the high temperature side to the low temperature side.

An electron in the case of n-type semiconductor and a hole in the case of p-type semiconductor are referred to as the majority carrier. When a temperature difference is produced between both ends of the thermoelectric conversion material, a small number of carriers having an electric charge opposite to that of the majority carrier are also generated. Such a carrier is referred to as the minority carrier. A hole in the case of n-type semiconductor and an electron in the case of p-type semiconductor are the minority carrier.

Simultaneously with transfer of the majority carrier from the high temperature side to the low temperature side, the minority carrier also transfers from the high temperature side to the low temperature side. The transfer of minority carrier adversely affects the thermoelectromotive force obtained by the transfer of majority carrier. At the time of production of a temperature difference between both ends of the thermoelectric conversion material, if the temperature of the thermoelectric conversion material is a high temperature of 300° C. or more, thermal excitation excessively occurs, and the number of minority carriers generated increases. As a result, adverse effect of the minority carrier on the thermoelectromotive force becomes stronger.

For enhancing the thermoelectromotive force, it is effective to allow smooth transfer of the majority carrier from the high temperature side to the low temperature side and prevent transfer of the minority carrier from the high temperature side to the low temperature side. In order to realize this, the thermoelectric conversion material comprises a matrix and a barrier material, and the interface between the matrix and the barrier material has the following band structure.

Figure 1:
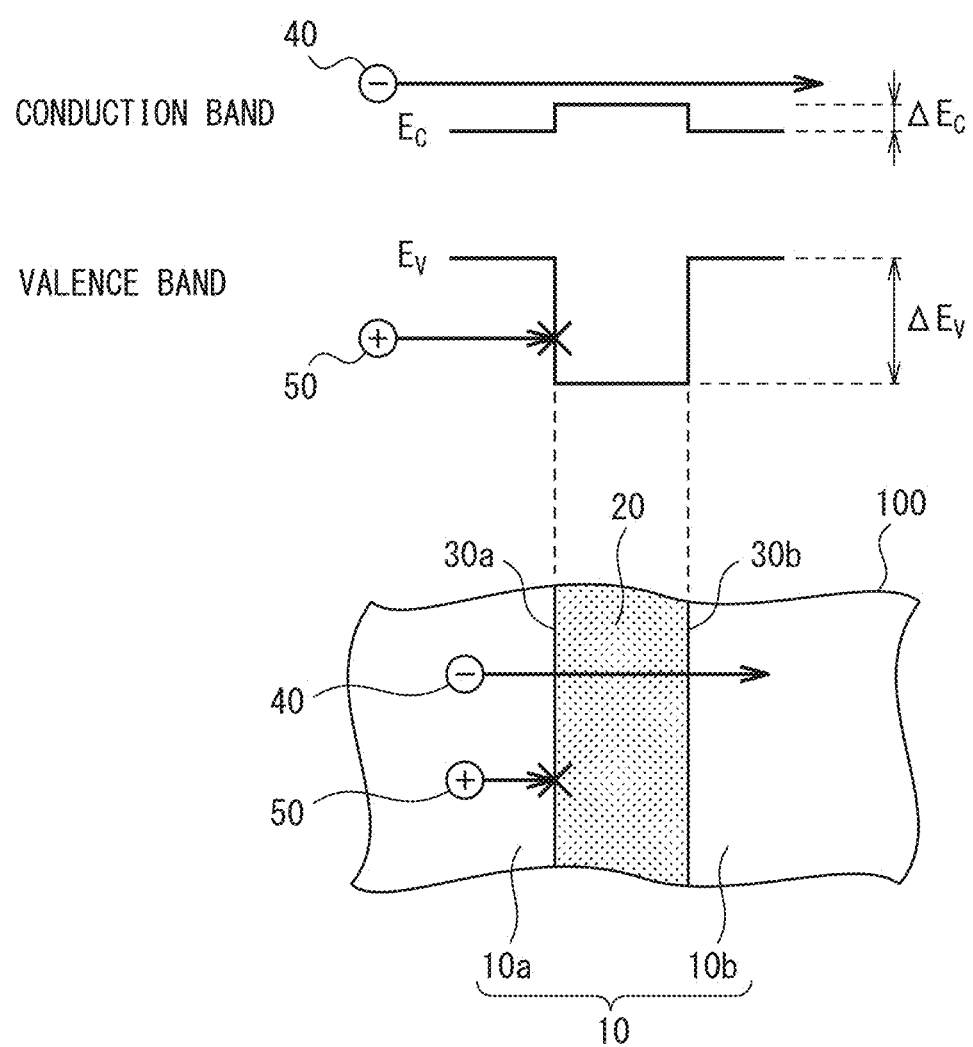
FIG. 1 is an explanatory diagram illustrating the energy level near the interface between the matrix (n-type) and the barrier material.

First, the case where the matrix (main component) of the thermoelectric conversion material is an n-type semiconductor is described. FIG. 1 is an explanatory diagram illustrating the energy level near the interface between the matrix (n-type) and the barrier material.

The thermoelectric conversion material 100 comprises a matrix 10 and a barrier material 20. In the thermoelectric conversion material 100, a temperature difference is produced, and the matrix 10 is divided into a high-temperature-side matrix 10a and a low-temperature-side matrix 10b by the barrier material 20. A high-temperature-side interface 30a is present between the high-temperature-side matrix 10a and the barrier material 20, and a low-temperature-side interface 30b is present between the barrier material 20 and the low-temperature-side matrix 10b.

On the upper side of the thermoelectric conversion material 100 of FIG. 1, an energy level Ec of the conduction band and an energy level Ev of the valence band in each of the high-temperature-side matrix 10a, the barrier material 20 and the low-temperature-side matrix 10b are shown.

In the high-temperature-side interface 30a and the low-temperature-side interface 30b, a band offset ΔEc is formed on the conduction band side. The bottom of the conduction band in each of the matrix 10a and the matrix 10b is lower than the bottom of the conduction band in the barrier material 20.

In addition, in the high-temperature-side interface 30a and the low-temperature-side interface 30b, a band offset ΔEv is formed on the valence band side. The top of the valence band in each of the matrix 10a and the matrix 10b is higher than the top of the valence band in the barrier material 20.

Since the matrix 10 is an n-type semiconductor, an electron 40 is the majority carrier. The smaller the band offset ΔEc on the conduction band side is, the more smoothly the electron 40 can transfer from the high-temperature-side matrix 10a to the low-temperature-side matrix 10b through the barrier material 20. The band offset ΔEc is preferably 0.1 eV or less, more preferably 0.05 eV or less, still more preferably 0.001 eV or less, and ideally 0 eV.

Since the matrix 10 is an n-type semiconductor, a hole 50 is the minority carrier. The larger the band offset ΔEv on the valence band side is, the easily transfer of the hole 50 from the high-temperature-side matrix 10a to the low-temperature-side matrix 10b through the barrier material 20 can be blocked at the high-temperature-side interface 30a. The band offset ΔEv is preferably 0.10 eV or more, more preferably 0.15 eV or more, still more preferably 0.20 eV or more.

Figure 2:
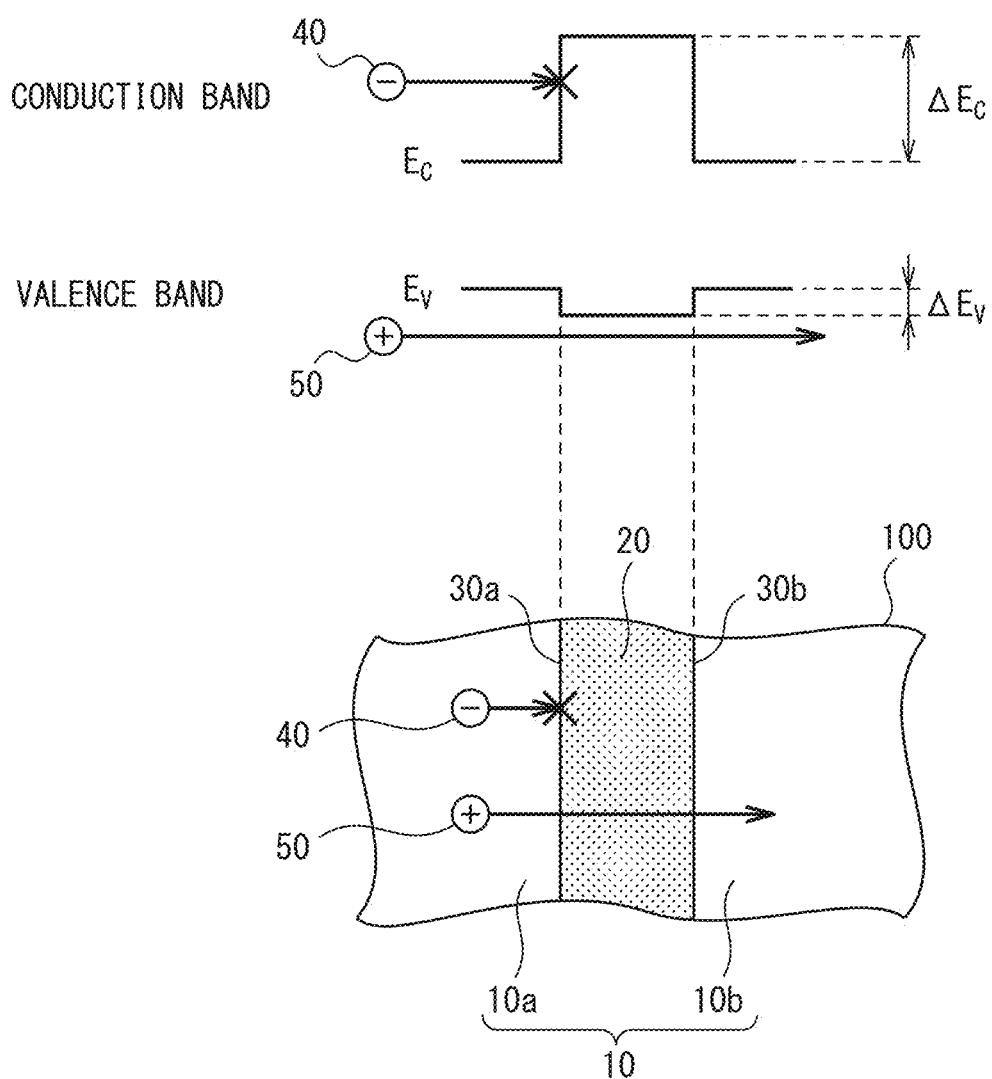
FIG. 2 is an explanatory diagram illustrating the energy level near the interface between the matrix (p-type) and the barrier material.

Next, the case where the matrix (main component) of the thermoelectric conversion material is a p-type semiconductor is described. Matters different from the case where the matrix (main component) of the thermoelectric conversion material is an n-type semiconductor are described. FIG. 2 is an explanatory diagram illustrating the energy level near the interface between the matrix (p-type) and the barrier material.

Since the matrix 10 is a p-type semiconductor, a hole 50 is the majority carrier. The smaller the band offset ΔEv on the valence band side is, the more smoothly the hole 50 can transfer from the high-temperature-side matrix 10a to the low-temperature-side matrix 10b through the barrier material 20. The band offset ΔEv is preferably 0.1 eV or less, more preferably 0.05 eV or less, still more preferably 0.001 eV or less, and ideally 0 eV.

Since the matrix 10 is a p-type semiconductor, an electron 40 is the minority carrier. The larger the band offset ΔEc on the conduction band side is, the easily transfer of the electron 40 from the high-temperature-side matrix 10a to the low-temperature-side matrix 10b through the barrier material 20 can be blocked at the high-temperature-side interface 30a. The band offset ΔEc is preferably 0.10 eV or more, more preferably 0.15 eV or more, still more preferably 0.20 eV or more.

The reason why the thermoelectromotive force is enhanced when the band structure of the interface 30 between the matrix 10 and the barrier material 20 is set as above, is described.

The thermoelectric performance of the thermoelectric conversion material can be evaluated by the thermoelectric conversion efficiency and electrical property, and when these are high, the thermoelectric performance is high. The thermoelectric conversion efficiency is denoted by ZT, and ZT is determined according to the following formula (A). The electric property of the thermoelectric conversion material is denoted by PF (power factor) and is determined according to the following formula (B).

$$ZT = \alpha^2 \times \sigma \times T/\kappa \quad (A)$$

$$PF = \alpha^2 \times \sigma \quad (B)$$

α: Seebeck coefficient
σ: electrical conductivity
κ: thermal conductivity
T: absolute temperature Since the Seebeck coefficient is a thermoelectromotive force per unit temperature, as seen from formula (A) and formula (B), the larger the thermoelectromotive force is, the larger ZT and PF are, and the thermoelectric performance of the thermoelectric conversion material is enhanced.

In the case where both the majority carrier and the minority carrier are present in the matrix, the Seebeck coefficient of the entire thermoelectric conversion material is represented by the following formula (C):

$$\alpha = (\alpha_e \sigma_e + \alpha_h \sigma_h)/(\sigma_e + \sigma_h) \quad (C)$$

$\alpha_e$: Seebeck coefficient when the carrier is only an electron
$\alpha_h$: Seebeck coefficient when the carrier is only a hole
$\sigma_e$: electrical conductivity when the carrier is only an electron
$\sigma_h$: electrical conductivity when the carrier is only a hole In the case where the matrix 10 is an n-type semiconductor, in formula (C), the portion represented by a denominator of $\sigma_h$ and a numerator of $\alpha_h \sigma_h$ indicates the size of a reversed electromotive force per unit temperature difference. In the case where the matrix 10 is a p-type semiconductor, in formula (C), the portion represented by a denominator of $\sigma_e$ and a numerator of $\alpha_e \sigma_e$ indicates the size of a reversed electromotive force per unit temperature difference.

$\alpha_e$ is a negative value, $\alpha_h$ is a positive value, and both $\sigma_e$ and $\sigma_h$ are a positive value. In formula (C), in order to increase the absolute value of α, the reversed electromotive force per unit temperature difference should be reduced.

In the case where the matrix 10 is an n-type semiconductor, since the portion represented by a denominator of $\sigma_h$ and a numerator of $\alpha_h \sigma_h$ should be reduced, the absolute value of $\alpha_h$, i.e., the absolute value of Seebeck coefficient of the hole 50, should be reduced. For this purpose, as described above, transfer of the hole 50 (minority carrier) from the high-temperature-side matrix 10a to the low-temperature-side matrix 10b through the barrier material 20 should be blocked at the high-temperature-side interface 30a.

In the case where the matrix 10 is a p-type semiconductor, since the portion represented by a denominator of $\sigma_e$ and a numerator of $\alpha_e \sigma_e$ should be reduced, the absolute value of $\alpha_e$, i.e., the absolute value of Seebeck coefficient of the electron 40, should be reduced. For this purpose, as described above, transfer of the electron 40 (minority carrier) from the high-temperature-side matrix 10a to the low-temperature-side matrix 10b through the barrier material 20 should be blocked at the high-temperature-side interface 30a.

The configuration requirements of the thermoelectric conversion material 100 comprising a matrix 10 and a barrier material 20 and having the above-described band structure are described below.

(Matrix)

The matrix 10 contains $Mg_2Si_{1-x}Sn_x$ (x is from 0.50 to 0.80) and an n-type dopant. The matrix 10 may be a polycrystal such as sintered body. The matrix 10 may contain an unavoidable impurity, in addition to $Mg_2Si_{1-x}Sn_x$ (x is from 0.50 to 0.80) and an n-type dopant. The unavoidable impurity includes an impurity whose inclusion cannot be avoided, such as impurity contained in a raw material, or an impurity that involves a significant rise in the production cost to avoid its inclusion. In $Mg_2Si_{1-x}Sn_x$ (x is from 0.50 to 0.80), part of $Mg_2Si$ is substituted by Sn, and a crystal is composed of a ratio of one atom of total of Si and Sn to two Mg atoms. Some of crystals in which the crystal is not composed of such a ratio are also included in the unavoidable impurity. The content of unavoidable impurities (excluding n-type dopant) is preferably 1.0 mass % or less, more preferably 0.5 mass % or less, still more preferably 0.1 mass % or less, relative to the entire thermoelectric conversion material.

($Mg_2Si_{1-x}Sn_x$)

x in $Mg_2Si_{1-x}Sn_x$ is from 0.50 to 0.80. When x is 0.50 or more, high ZT is obtained due to effects of density of states and alloy scattering. In view of ZT, x may be 0.60 or more, or 0.70 or more. On the other hand, when x is 0.80 or less, the heat resistance is prevented from extreme reduction. In view of heat resistance, x may be 0.75 or less.

(n-Type Dopant)

The matrix 10 contains an n-type dopant. The n-type dopant makes the matrix 10 an n-type semiconductor. When a temperature difference is provided between both ends of the thermoelectric conversion material 100 by containing an n-type dopant in the matrix 10, carriers are generated to cause power generation. The carrier includes a majority carrier and a minority carrier, and while the majority carrier contributes to power generation, the minority carrier inhibits power generation. Since the matrix 10 is an n-type semiconductor, the majority carrier is an electron 40, and the minority carrier is a hole 50.

The n-type dopant includes Sb, Bi and Al, and the matrix 10 may contain one or more members selected from Sb, Bi and Al.

The content of the n-type dopant is preferably 0.001 at % or more relative to $Mg_2Si_{1-x}Sn_x$ (x is from 0.50 to 0.80). When the content of the n-type dopant is 0.001 at % or more, the effect due to containing the n-type dopant is clearly manifested. From this viewpoint, the content of the n-type dopant is more preferably 0.010 at % or more, still more preferably 0.100 at % or more.

When the content of the n-type dopant is 5.000 at % or less relative to $Mg_2Si_{1-x}Sn_x$ (x is from 0.50 to 0.80), the dopant does not inhibit the thermoelectric performance of the matrix 10. From this viewpoint, the content of the n-type dopant is more preferably 3.000 at % or less, still more preferably 1.000 at % or less.

(Barrier Material)

The barrier material 20 contains $Mg_2Si_{1-y}Sn_y$ (y is from 0 to 0.30). As long as y is within the range of 0 to 0.30, the barrier material 20 may contain a plurality of kinds of $Mg_2Si_{1-y}Sn_y$ (y is from 0 to 0.30). For example, the barrier material 20 may contain both $Mg_2Si$ and $Mg_2Si_{0.70}Sn_{0.30}$. The barrier material 20 may be a polycrystal such as sintered body. The barrier material 20 may contain an unavoidable impurity, in addition to $Mg_2Si_{1-y}Sn_y$ (y is from 0 to 0.30). The unavoidable impurity includes an impurity whose inclusion cannot be avoided, such as impurity contained in a raw material, or an impurity that involves a significant rise in the production cost to avoid its inclusion. $Mg_2Si_{1-y}Sn_y$ (y is from 0 to 0.30) is $Mg_2Si$, or part of $Mg_2Si$ is substituted by Sn, and a crystal is composed of a ratio of one atom of total of Si and Sn to two Mg atoms. Some of crystals in which the crystal is not composed of such a ratio are also included in the unavoidable impurity. The content of unavoidable impurities is preferably 1.0 mass % or less, more preferably 0.5 mass % or less, still more preferably 0.1 mass % or less, relative to the entire thermoelectric conversion material.

($Mg_2Si_{1-y}Sn_y$)

y of $Mg_2Si_{1-y}Sn_y$ is from 0 to 0.30. When y is 0, $Mg_2Si_{1-y}Sn_y$ is $Mg_2Si$. When y is from 0 to 0.30, the melting point of $Mg_2Si_{1-y}Sn_y$ (y is from 0 to 0.30) is higher than the melting point of $Mg_2Si_{1-x}Sn_x$ (x is from 0.50 to 0.80) of the matrix 10. Consequently, at least part of the barrier material 20 is present in a grain boundary of the matrix 10, or at least part of the barrier material 20 is dispersed in the matrix 10. Alternately, the barrier material 20 is sandwiched between matrices, and the barrier material 20 and the matrix 10 are stacked. The reason therefor is described in detail in the description of the production method of the thermoelectric conversion material 100. The melting point of $Mg_2Si_{1-x}Sn_x$ (x is from 0.50 to 0.80) is from 800 to 1,000° C., and the melting point of $Mg_2Si_{1-y}Sn_y$ (y is from 0 to 0.30) is from 1,000 to 1,090° C.

When y of $Mg_2Si_{1-y}Sn_y$ is from 0 to 0.30, the band offset $\Delta Ev$ on the valence band side can be made 0.1 eV or more at the high-temperature-side interface 30a and low-temperature-side interface 30b of the matrix 10 of $Mg_2Si_{1-x}Sn_x$ (x is from 0.50 to 0.80). Consequently, transfer of the hole 50 as the minority carrier from the high-temperature-side matrix 10a to the low-temperature-side matrix 10b through the barrier material 20 can be blocked at the high-temperature-side interface 30a. From this viewpoint, y is preferably 0.20 or less, more preferably 0.15 or less, still more preferably 0.10 or less.

When y of $Mg_2Si_{1-y}Sn_y$ is from 0 to 0.30, the band offset $\Delta Ec$ on the conduction band side can be made 0.1 eV or less at the high-temperature-side interface 30a and low-temperature-side interface 30b of the matrix 10 of $Mg_2Si_{1-x}Sn_x$ (x is from 0.50 to 0.80). Consequently, the electron 40 as the majority carrier can smoothly transfer from the high-temperature-side matrix 10a to the low-temperature-side matrix 10b through the barrier material 20.

Figure 3:
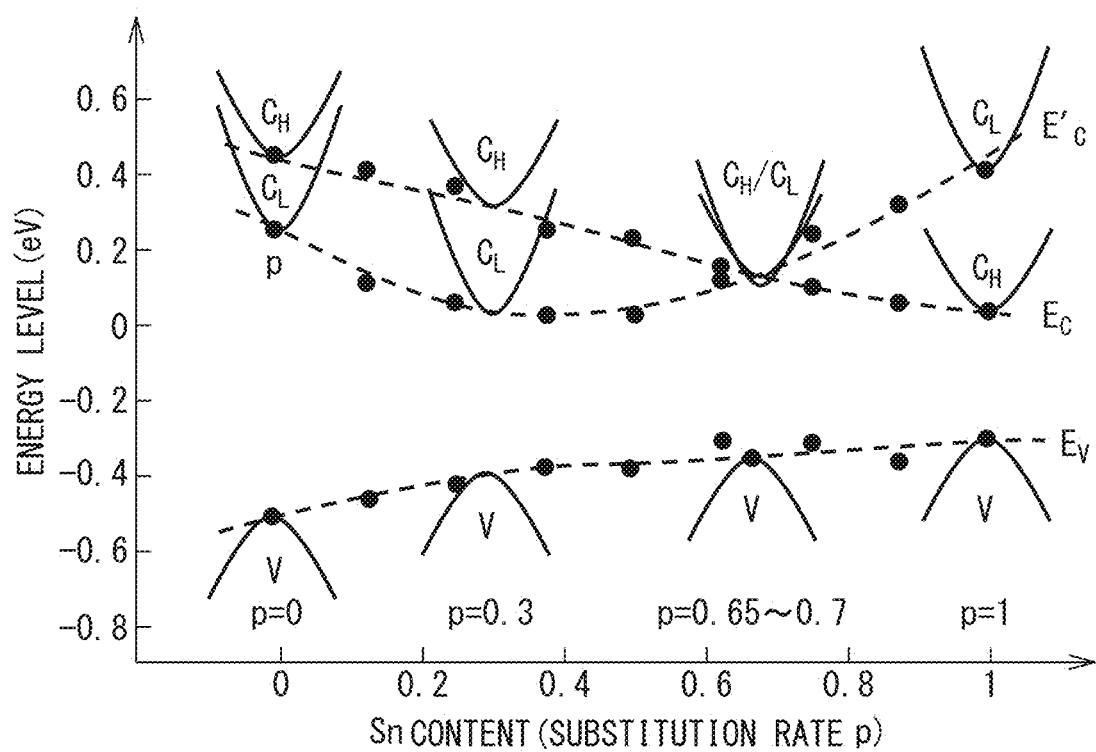
FIG. 3 is a graph illustrating the relationship between the Sn content in $Mg_2Si_{1-p}Sn_p$ and the energy level.

FIG. 3 is a graph illustrating the relationship between the Sn content in $Mg_2Si_{1-p}Sn_p$ and the energy level. The abscissa represents the rate at which Si in $Mg_2Si$ is substituted by Sn (substitution rate p), and the ordinate represents the energy level (eV). The left end (p=0) of the abscissa is $Mg_2Si$, and the right end (p=1) of the abscissa is $Mg_2Sn$. The source of FIG. 3 is Wei Liu, et al., Physical Review Letters, 108, 166601, (2012).

As illustrated in FIG. 3, as the Sn content in $Mg_2Si_{1-p}Sn_p$ increases, the top Ev of the valence band rises.

As illustrated in FIG. 3, as the Sn content in $Mg_2Si_{1-p}Sn_p$ increases, the bottom Ec of the conduction band in a certain orientation of the crystal represented by $Mg_2Si_{1-p}Sn_p$ falls. In addition, in the range where p of $Mg_2Si_{1-p}Sn_p$ is from 0 to about 0.5, as the Sn content in $Mg_2Si_{1-p}Sn_p$ increases, the bottom Ec' of the conduction band in a different orientation of the crystal represented by $Mg_2Si_{1-p}Sn_p$ falls, and in the range where p is from about 0.5 to 1.0, as the Sn content in $Mg_2Si_{1-p}Sn_p$ increases, the bottom Ec' of the conduction band in the different orientation of the crystal represented by $Mg_2Si_{1-p}Sn_p$ rises.

As understood from these, the top of the valence band does not rely on the crystal orientation of $Mg_2Si_{1-p}Sn_p$, whereas the bottom of the conduction band relies on the crystal orientation of $Mg_2Si_{1-p}Sn_p$.

Since the matrix 10 and the barrier material 20 are a polycrystal, the matrix 10 and the barrier material 20 have various crystal orientations. The top of the valence band does not rely on the crystal orientation of $Mg_2Si_{1-p}Sn_p$, and therefore the band offset $\Delta Ev$ can be estimated from FIG. 3. The difference between Ev (p: 0.5-0.8) when p is from 0.5 to 0.8 and Ev (p: 0-0.3) when p is from 0 to 0.3 is 0.1 eV or more, and Ev (p: 0-0.3) is lower than Ev (p: 0.5-0.8). This means that a band offset $\Delta Ev$ of 0.1 eV or more can be formed at the high-temperature-side interface 30a and low-temperature-side interface 30b between $Mg_2Si_{1-y}Sn_y$ (y is from 0 to 0.30) of the barrier material 20 and $Mg_2Si_{1-x}Sn_x$ (x is from 0.50 to 0.80) of the matrix 10.

The larger the band offset $\Delta Ev$ is, the more easily transfer of the hole 50 as the minority carrier can be blocked at the high-temperature-side interface 30a. For this reason, y of 0.30 or less is preferably 0.20 or less, more preferably 0.15 or less, still more preferably 0.10 or less.

As the thermoelectric conversion material, in view of its use, the electrical resistivity is preferably 50 μΩm or less. When the band offset $\Delta Ec$ on the conduction band side is 0.1 eV or less, the electrical resistivity can be readily controlled to 50 μΩm or less. It has been confirmed by experimentation that when the main component of the matrix 10 is $Mg_2Si_{1-x}Sn_x$ (x is from 0.50 to 0.80) and the main component of the barrier material 20 is $Mg_2Si_{1-y}Sn_y$ (y is from 0 to 0.30), the electrical resistivity becomes 50 μΩm or less.

In this way, after the composition affording a desired band offset $\Delta Ev$ is determined, it should be confirmed that the electrical resistivity in a range causing no problem in practice is achieved with the composition.

In the case where conduction of the electron 40 as the majority carrier is blocked at the high-temperature-side interface 30a of the barrier material 20, the thermoelectric conversion material 100 may comprise the later-described intermediate material, in addition to the matrix 10 and the barrier material 20. When the thermoelectric conversion material 100 comprises an intermediate material, the band offset $\Delta Ec$ on the conduction band side can be more reduced by band bending in the vicinity of the interface. Consequently, the electron 40 as the majority carrier can be more smoothly transferred from the high-temperature-side matrix 10a to the low-temperature-side matrix 10b though the intermediate material, the barrier material 20 and the intermediate material. As a result, the thermoelectromotive force can be more enhanced.

The embodiment of the barrier material 20 is described below. The barrier material 20 can take the following first to fifth embodiments and combinations thereof but is not limited thereto. Incidentally, the descriptions of first to fifth embodiments assume that the matrix 10 and the barrier material 20 satisfy the configuration requirements described hereinbefore.

(First Embodiment of Barrier Material)

Figure 4:
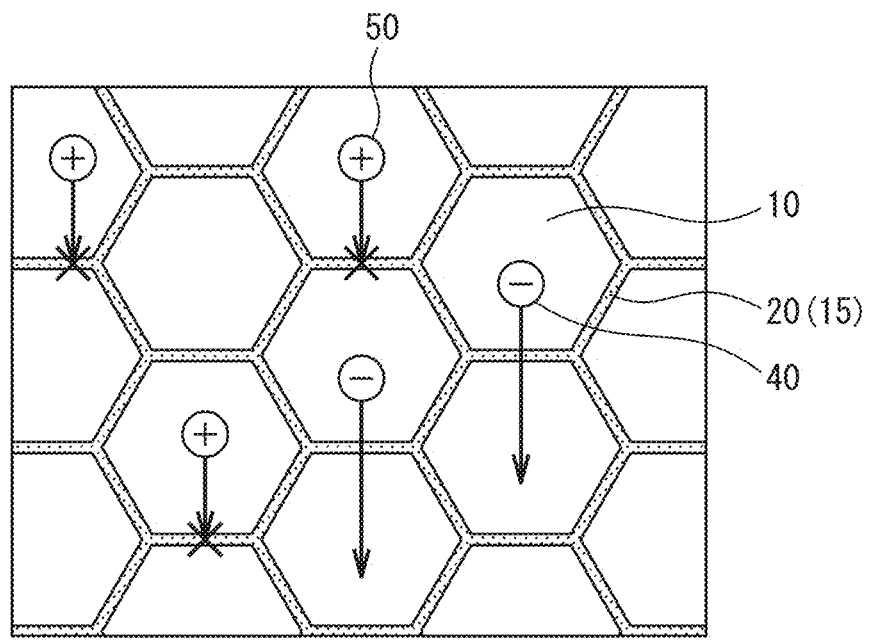
FIG. 4 is an explanatory diagram schematically illustrating a first embodiment of the barrier material.

FIG. 4 is an explanatory diagram schematically illustrating a first embodiment of the barrier material 20. FIG. 4 depicts part of the thermoelectric conversion material 100. In FIG. 4, the upper side is the high temperature side, and the lower side is the low temperature side.

The barrier material 20 is present in a grain boundary 15 of the matrix 10. In FIG. 4, all of the barrier material 20 are present in the grain boundary 15 of the matrix 10, but the configuration is not limited thereto, and part of the barrier material 20 may be present in a portion except for the grain boundary 15 of the matrix 10. In other words, it suffices if at least part of the barrier material 20 is present in the grain boundary 15 of the matrix 10.

In FIG. 4, the behaviors of electron 40 and hole 50 are also depicted. Since the matrix 10 is an n-type semiconductor, the electron 40 is the majority carrier, and the hole 50 is the minority carrier. The electron 40 transfers from the high-temperature-side matrix 10 to the low-temperature-side matrix 10 through the barrier material 20. On the other hand, transfer of the hole 50 is blocked at the interface between the barrier material 20 and the matrix 10.

The minority carrier is readily generated in a region close to the high temperature side but is generated also in other regions. The grain boundary 15 of the matrix 10 is present not only in a region close to the high temperature side but also in other regions. That is, the grain boundary 15 is present over a wide range of the thermoelectric conversion material 100. Since the barrier material 20 is present in the grain boundary 15 of the matrix 10, transfer of not only the minority carrier generated in a region close to the high temperature side but also the minority carrier generated in other regions can be blocked at the interface between the barrier 20 and the matrix 10.

The barrier material 20 is preferably present in 60% or more of the grain boundary 15 of the matrix 10. When the barrier material 20 is present in 60% or more of the grain boundary 15, the probability of blocking the transfer of the minority carrier by the barrier material 20 increases. From this viewpoint, the barrier material 20 is preferably present in 70% or more of the grain boundary 15 of the matrix 10, and the barrier material 20 is more preferably present in 80% or more of the grain boundary 15 of the matrix 10. Here, 60% or more of the grain boundary 15 of the matrix 10 indicates 60% or more relative to the total length of the grain boundary 15. The total length of the grain boundary 15 of the matrix 10 is determined by collecting a sample from an arbitrary position of the thermoelectric conversion material 100 and observing the texture of the sample.

(Second Embodiment of Barrier Material)

Figure 5:
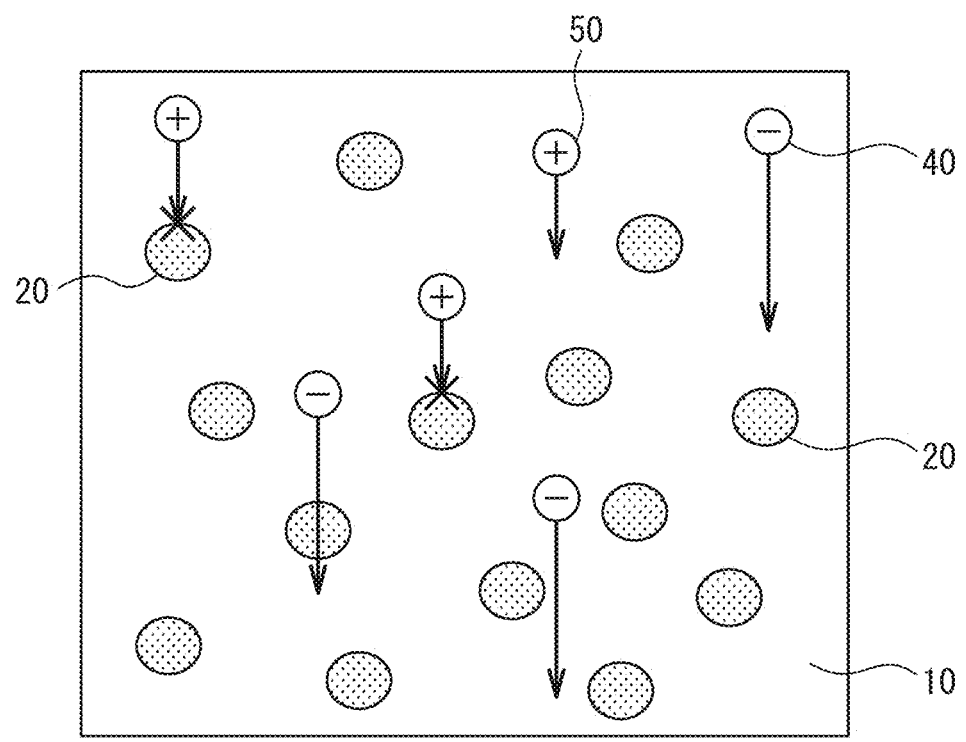
FIG. 5 is an explanatory diagram schematically illustrating a second embodiment of the barrier material.

FIG. 5 is an explanatory diagram schematically illustrating a second embodiment of the barrier material 20. FIG. 5 depicts part of the thermoelectric conversion material 100. In FIG. 5, the upper side is the high temperature side, and the lower side is the low temperature side.

The barrier material 20 is dispersed in the matrix 10. In FIG. 5, all of the barrier material 20 are dispersed in the matrix 10, but the configuration is not limited thereto, and part of the barrier material 20 may be present in a portion except for in the matrix 10. For example, as in the first embodiment, part of the barrier material 20 may be present in a grain boundary of the matrix 10. In other words, at least part of the barrier material 20 may be dispersed in the matrix 10.

In FIG. 5, the behaviors of electron 40 and hole 50 are also depicted. Since the matrix 10 is an n-type semiconductor, the electron 40 is the majority carrier, and the hole 50 is the minority carrier. Even when a barrier material 20 is present, the electron 40 transfers from the high temperature side to the low temperature side in the matrix 10 through the barrier material 20. On the other hand, when a barrier material 20 is present, transfer of the hole 50 is blocked at the interface between the barrier material 20 and the matrix 10.

The minority carrier is readily generated in a region close to the high temperature side but is generated also in other regions. The barrier material 20 is dispersed not only in a region close to the high temperature side of the matrix 10 but also dispersed in other regions. That is, the barrier material 20 is dispersed over a wide range of the thermoelectric conversion material 100. Consequently, transfer of not only the minority carrier generated in a region close to the high temperature side but also the minority carrier generated in other regions can be blocked at the interface between the barrier 20 and the matrix 10.

(Third Embodiment of Barrier Material)

Figure 6:
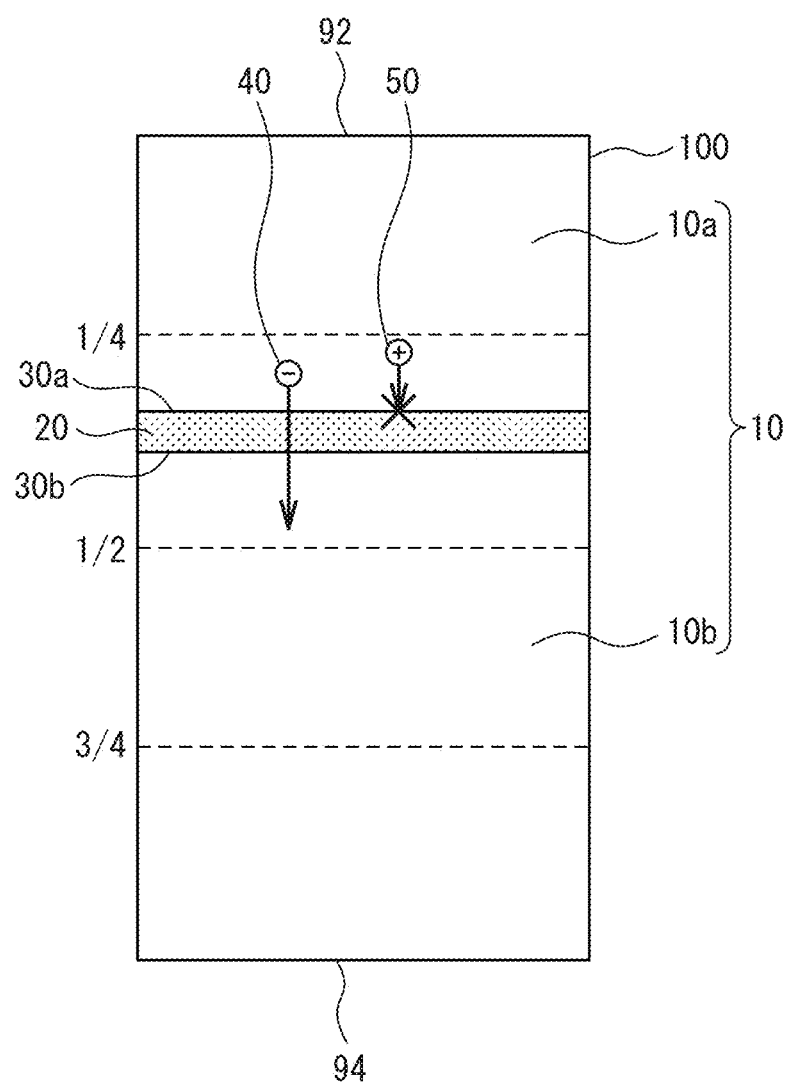
FIG. 6 is an explanatory diagram schematically illustrating a third embodiment of the barrier material.

FIG. 6 is an explanatory diagram schematically illustrating a third embodiment of the barrier material 20. In the thermoelectric conversion material 100, one end is the high temperature side 92, and another end is the low temperature side 94. When an electrode is connected to each of one end and another end of the thermoelectric conversion material 100, a thermoelectric conversion element is obtained. Incidentally, one end and another end are end parts in the stacking direction of the matrix 10 and the barrier material 20.

In FIG. 6, to facilitate the following description and for the sake of convenience, the positions at which the thermoelectric conversion material 100 is divided into four equal parts are shown by broken lines. In the following description, the segment spanning between the high temperature side 92 and just before ¼ of the entire thermoelectric conversion material 100 is sometimes referred to as "first equal part from the high temperature side 92"; the segment spanning between ¼ and just before ½ of the entire thermoelectric conversion material 100 is sometimes referred to as "second equal part from the high temperature side 92"; the segment spanning between ½ and just before ¾ of the entire thermoelectric conversion material 100 is sometimes referred to as "third equal part from the high temperature side 92"; and the segment spanning between ¾ of the entire thermoelectric conversion material 100 and the low temperature side 94 is sometimes referred to as "fourth equal part from the high temperature side 92".

The barrier material 20 is sandwiched between the high-temperature-side matrix 10a and the low-temperature-side matrix 10b, and the high-temperature-side matrix 10a, the low-temperature-side matrix 10b, and the barrier material 20 are stacked. Since the high-temperature-side matrix 10a and the low-temperature-side matrix 10b are different only in the position and are the same substance, the barrier material 20 is sandwiched between the matrices 10, and the barrier material 20 and the matrix 10 are stacked.

In the embodiment illustrated in FIG. 6, one layer of the barrier material 20 is formed in the second equal part from the high temperature side 92, but the configuration is not limited thereto. As long as the barrier material 20 is sandwiched between the matrices 10 and the barrier material 20 and the matrix 10 are stacked, two or more layers of the barrier material 20 may be formed. The case where two or more layers of the barrier material 20 are formed is described in the following fourth embodiment.

In FIG. 6, the behaviors of electron 40 and hole 50 are also depicted. Since the matrix 10 is an n-type semiconductor, the electron 40 is the majority carrier, and the hole 50 is the minority carrier. Even when a barrier material 20 is present, the electron 40 transfers from the high-temperature-side matrix 10a to the low-temperature-side matrix 10b through the barrier material 20. Transfer of the hole 50 is blocked at the high-temperature-side interface 30a between the barrier material 20 and the high-temperature-side matrix 10a.

(Fourth Embodiment of Barrier Material)

Figure 7:
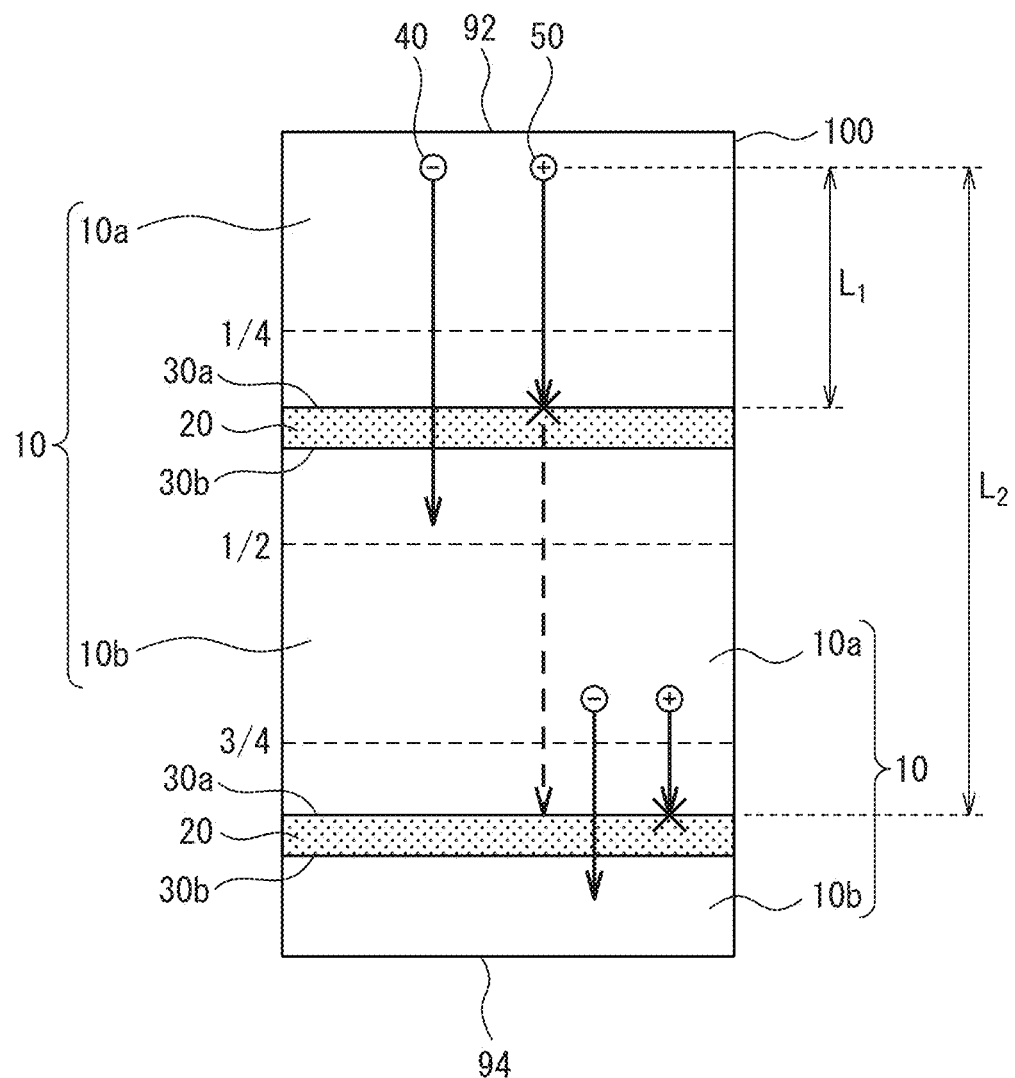
FIG. 7 is an explanatory diagram schematically illustrating a fourth embodiment of the barrier material.

FIG. 7 is an explanatory diagram schematically illustrating a fourth embodiment of the barrier material 20. In the thermoelectric conversion material 100, one end is the high temperature side 92, and another end is the low temperature side 94. One end and another end are end parts in the stacking direction of the matrix 10 and the barrier material 20. In FIG. 7, as with FIG. 6, the positions at which the thermoelectric conversion material 100 is divided into four equal parts are shown by broken lines. In the description of the fourth embodiment, similarly to the description of the third embodiment, "first equal part from the high temperature side 92", etc. may also be referred to.

One layer of the barrier material 20 is formed in each of the second equal part from the high temperature side 92 (hereinafter, sometimes simply referred to as "second equal part") and the fourth equal part from the high temperature side (hereinafter, sometimes simply referred to as "fourth equal part"). That is, one layer of the barrier material 20 is formed in each of the second equal part and the fourth equal part, and two layers of the barrier layer 20 are formed in the entire thermoelectric conversion material 100.

The barrier material 20 in the second equal part is sandwiched between the high-temperature-side matrix 10a and the low-temperature-side matrix 10b in the second equal part.

The barrier material 20 in the fourth equal part is sandwiched between the high-temperature-side matrix 10a and the low-temperature-side matrix 10b in the fourth equal part. As described above, the broken line of FIG. 6 is depicted for the sake of convenience, and therefore in the entire thermoelectric conversion material 100, five layers are stacked in order of matrix 10-barrier material 20-matrix 10-barrier material 20-matrix 10 from the high temperature side 92 toward the low temperature side 94.

As long as the barrier material 20 is sandwiched between the matrices 10 and the barrier material 20 and the matrix 10 are stacked, the embodiment where two or more layers of the barrier material 20 is not limited to the embodiment illustrated in FIG. 7. For example, similarly to the barrier material 20 in the second equal part, the barrier material 20 may be formed in each of the first equal part and the third equal part. In other words, nine layers in total may be stacked in the entire thermoelectric conversion material 100, where the matrix 10 and the barrier material 20 are alternately stacked and one end on the high temperature side 92 and another end on the low temperature side 94 are the matrix 10.

In addition, for example, two or more layers of the barrier material 20 may be formed in order of matrix 10-barrier material 20-matrix 10-barrier material 20-matrix 10 in the second equal part. That is, the entire thermoelectric conversion material 100 may have a configuration where the matrix 10 and the barrier material 20 are alternately stacked and one end on the high temperature side 92 and another end on the low temperature side 94 are the matrix 10.

In the case where two or more layers of the barrier material 20 are formed as above, at least one layer of the barrier material 20 is preferably formed in the second equal part from the high temperature side 92. The reason therefor is described below by referring to the embodiment illustrated in FIG. 7.

In FIG. 7, the behaviors of electron 40 and hole 50 are also depicted. Since the matrix 10 is an n-type semiconductor, the electron 40 is the majority carrier, and the hole 50 is the minority carrier. The arrow depicted by a broken line shows the behavior of the hole 50 of which transfer is blocked at the high-temperature-side interface 30a of the barrier material 20 in the fourth equal part when a barrier material 20 in the second equal part is not formed.

Also in the barrier materials 20 in both the second equal part and the fourth equal part, the electron 40 transfers from the high-temperature-side matrix 10a to the low-temperature-side matrix 10b through the barrier material 20. On the other hand, in the barrier materials 20 in both the second equal part and the fourth equal part, transfer of the hole 50 is blocked at the high-temperature-side interface 30a between the barrier material 20 and the high-temperature-side matrix 10a.

In the embodiment illustrated in FIG. 7, if the barrier material 20 in the second equal part is not formed, as shown by the broken line arrow, transfer of the hole 50 is blocked at the high-temperature-side interface 30a of the barrier material 20 in the fourth equal part. As illustrated in FIG. 7, compared with the case where transfer of the hole 50 is blocked at the high-temperature-side interface 30a of the barrier material 20 in the second equal part, if transfer of the hole 50 is blocked at the high-temperature-side interface 30a of the barrier material 20 in the fourth equal part, the minority carrier experiences an excess transfer by the distance indicated by $L_2-L_1$. Consequently, the hole 50 significantly decreases the thermoelectromotive force of the thermoelectric conversion material 100 in the course of transferring the excess distance. In addition, inside the thermoelectric conversion material 100, the minority carrier is likely to be generated closer to the high temperature side 92. For these reasons, the minority carrier is preferably blocked in the second equal part. For the reasons above, at least one layer of the barrier material 20 is preferably formed in the second equal part from the high temperature side 92.

(Fifth Embodiment of Barrier Material)

Figure 8:
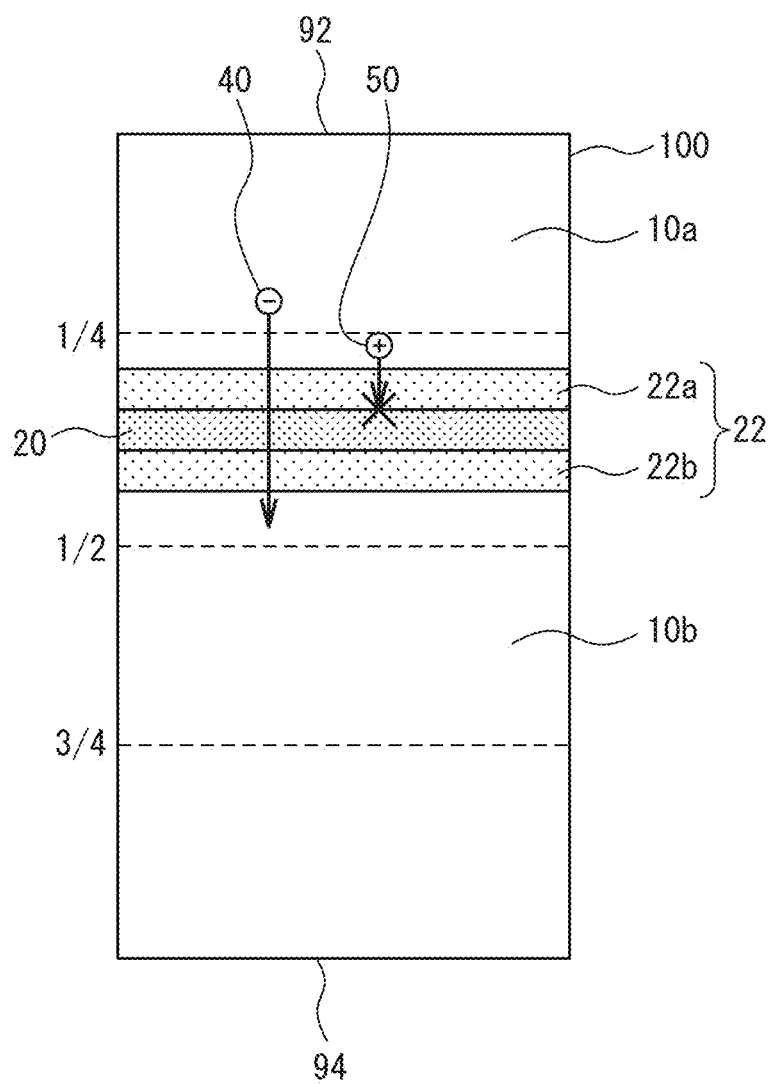
FIG. 8 is an explanatory diagram schematically illustrating a fifth embodiment of the barrier material.

FIG. 8 is an explanatory diagram schematically illustrating a fifth embodiment of the barrier material 20. In the thermoelectric conversion material 100, one end is the high temperature side 92, and another end is the low temperature side 94. One end and another end are end parts in the stacking direction of the matrix 10 and the barrier material 20. In FIG. 8, as with FIG. 6, the positions at which the thermoelectric conversion material 100 is divided into four equal parts are shown by broken lines. In the description of the fifth embodiment, similarly to the third embodiment, "first equal part from the high temperature side 92", etc. may also be referred to.

In the fifth embodiment, a high-temperature-side intermediate material 22a is further stacked between the high-temperature-side matrix 10a and the barrier material 20. In addition, a low-temperature-side intermediate material 22b is further stacked between the low-temperature-side matrix 10b and the barrier material 20.

In the embodiment illustrated in FIG. 8, both a high-temperature-side intermediate material 22a and a low-temperature-side intermediate material 22b are stacked, but the configuration is not limited thereto, and only either one of a high-temperature-side intermediate material 22a and a low-temperature-side intermediate material 22b may be stacked.

In addition, when two or more layers of the barrier 20 are stacked in the thermoelectric conversion material 100, the intermediate material 22 may be stacked on all of the barrier material 20, or the intermediate material 22 may be stacked on at least one layer of the barrier material 20. That is, the intermediate material 22 may be further stacked between the matrix 10 and at least one layer of the barrier material 20.

The intermediate material 22 contains $Mg_2Si_{1-z}Sn_z$ (z is more than 0.30 and less than 0.50). The intermediate material 22 may be a polycrystal such as sintered body. The intermediate material 22 may contain an unavoidable impurity, in addition to $Mg_2Si_{1-z}Sn_z$ (z is more than 0.30 and less than 0.50). The unavoidable impurity includes an impurity whose inclusion cannot be avoided, such as impurity contained in a raw material, or an impurity that involves a significant rise in the production cost to avoid its inclusion. In $Mg_2Si_{1-z}Sn_z$ (z is more than 0.30 and less than 0.50), part of $Mg_2Si$ is substituted by Sn, and a crystal is composed of a ratio of one atom of total of Si and Sn to two Mg atoms. Some of crystals in which the crystal is not composed of such a ratio are also included in the unavoidable impurity. The content of unavoidable impurities is preferably 1.0 mass % or less, more preferably 0.5 mass % or less, still more preferably 0.1 mass % or less, relative to the entire thermoelectric conversion material.

While the matrix 10 contains $Mg_2Si_{1-x}Sn_x$ (x is from 0.50 to 0.80) and the barrier material 20 contains $Mg_2Si_{1-y}Sn_y$ (y is from 0 to 0.30), the intermediate material 22 contains $Mg_2Si_{1-z}Sn_z$ (z is more than 0.30 and less than 0.50). Both the matrix 10 and the intermediate material 22 contain magnesium silicide in which part of $Mg_2Si$ is substituted by Sn. The barrier material 20 contains $Mg_2Si$ or magnesium silicide in which part of $Mg_2Si$ is substituted by Sn. The substitution amount with Sn in the intermediate material 22 is intermediate between the substitution amounts with Sn in the matrix 10 and the barrier material 20 (hereinafter, the fact that the intermediate material 22 has such a substitution amount with Sn is sometimes referred to as "the intermediate material 22 has an intermediate substitution amount").

The coefficient of thermal expansion of $Mg_2Si_{1-x}Sn_x$ (x is from 0.50 to 0.80) as the main component of the matrix 10 greatly differs from the coefficient of thermal expansion of $Mg_2Si_{1-y}Sn_y$ (y is from 0 to 0.30) as the main component of the barrier material 20. Because of such a difference, when the thermoelectric conversion material 100 reaches a high temperature of 100° C. or more, cracking may occur at the interface between the high-temperature-side matrix 10a and the barrier material 20 or at the interface between the low-temperature-side matrix 10b and the barrier material 20. By virtue of the fact that the intermediate material 22 has an intermediate substitution amount, occurrence of such cracking can be prevented.

In addition, when the intermediate material 22 has an intermediate substitution amount, the band offset ΔEc on the conduction band side can be reduced due to band bending in the vicinity of interface. Consequently, the electron 40 as the majority carrier can further smoothly transfer from the high-temperature-side matrix 10a to the low-temperature-side matrix 10b through the intermediate material 22a, the barrier material 20 and the barrier material 22b. As a result, the thermoelectromotive force can be enhanced.

The thickness of the intermediate material 22 may be sufficient if the above-described effects are obtained, and the thickness is not particularly limited. The thickness may be, for example, 5 μm or more, 10 μm or more, or 50 μm or more, and may be 500 μm or less, 200 μm or less, or 100 μm or less. In the case where the intermediate material 22 has a high-temperature-side intermediate material 22a and/or a low-temperature-side intermediate material 22b, the thickness above is the thickness of each of the high-temperature-side intermediate material 22a and the low-temperature-side intermediate material 22b.

(Intermediate Material when Having Barrier Material in First Embodiment and/or Second Embodiment)

Also when the thermoelectric conversion material 100 comprises the barrier material 20 in the first embodiment and second embodiment, the thermoelectric conversion material 100 may further comprise an intermediate material. In this case, the form of the intermediate material may be a form of being present in a grain boundary of the matrix 10, being dispersed in the matrix 10, or combinations thereof. Such an intermediate material contains $Mg_2Si_{1-z}Sn_z$ (z is more than 0.30 and less than 0.50). When the thermoelectric conversion material 100 comprises an intermediate material, the band offset ΔEc on the conduction band side can be reduced due to band bending in the vicinity of interface. As a result, the electron 40 as the majority carrier can more smoothly transfer from the high temperature side to the low temperature side, and the thermoelectromotive force can be enhanced.

The content of the intermediate material is preferably from 5 to 40 vol % relative to the barrier material. The volume fraction of the intermediate material is the same as the area rate of the intermediate material when the texture of the barrier material is observed. When the volume fraction of the intermediate material is 5 vol % or more, the effect of reducing the band offset ΔEc on the conduction band side is clearly manifested. From this viewpoint, the content of the intermediate material may be 10 vol % or more, 15 vol % or more, or 20 vol % or more. On the other hand, when the content of the intermediate material is 40 vol % or less, the thermoelectric performance is not deteriorated. From this viewpoint, the content of the intermediate material may be 35 vol % or less, 30 vol % or less, or 25 vol % or less.

(Content of Barrier Material in First Embodiment and/or Second Embodiment)

In the case where the thermoelectric conversion material 100 comprises the barrier material 20 in the first embodiment and/or second embodiment, it is preferable to contain from 5 to 20 vol % of the barrier material 20 relative to the entire thermoelectric conversion material 100. The volume fraction of the barrier material 20 is the same as the area rate of the barrier material 20 when the texture of the thermoelectric conversion material 100 is observed.

When the content of the barrier material 20 is 5 vol % or more, the effect of blocking transfer of the electron 40 by the barrier material 20 is clearly recognized. From the viewpoint of blocking transfer of the electron 40, the content of the barrier material 20 is more preferably 10 vol % or more, still more preferably 12 vol % or more. In the case where the thermoelectric conversion material 100 comprises the barrier material 20 in the first embodiment, when 10 vol % or more of the barrier material 20 is contained, the barrier material 20 is present in 80% or more of the grain boundary 15 of the matrix 10.

On the other hand, when the content of the barrier material 20 is 20 vol % or less, the thermoelectric performance is not deteriorated. In view of deterioration of thermoelectric performance, the content of the barrier material 20 is more preferably 18 vol % or less, still more preferably 15 vol % or less.

(Thickness of Barrier Material in Third Embodiment, Fourth Embodiment and/or Fifth Embodiment)

In the case where the thermoelectric conversion material 100 comprises the barrier material 20 in the third embodiment, fourth embodiment and/or fifth embodiment, the thickness of the barrier material 20 is preferably from 10 to 500 μm.

The form of the barrier material 20 in the third embodiment, fourth embodiment and/or fifth embodiment is a layered form. For example, describing this by referring to FIG. 6 (third embodiment), the layered barrier material 20 blocks transfer of the hole 50 from the high-temperature-side matrix 10a to the low-temperature-side matrix 10b. When the thickness of the barrier material 20 is 10 μm or more, the existence probability of a passage communicating between the high-temperature-side matrix 10a and the low-temperature-side matrix 10b decreases, and it becomes easy to block the hole 50 from passing through the barrier material 20. From the viewpoint of decreasing the existence probability of communication passage, the thickness of the barrier material 20 is more preferably 100 μm or more, still more preferably 200 μm or more.

On the other hand, when the thickness of the barrier material 20 is 500 μm or less, the hole 50 can be prevented from easily passing through the barrier material 20 due to generation of a crack in the barrier material 20. It is because, when the thickness of the barrier material 20 is 500 μm or less, the barrier material 20 can be prevented from becoming brittle to cause generation of a crack in the barrier material 20 and allow the crack to serve as the communication passage between the high-temperature-side matrix 10a and the low-temperature-side matrix 10b. From the viewpoint of preventing the barrier material 20 from becoming brittle, the thickness of the barrier material 20 is more preferably 450 μm or less, still more preferably 400 μm or less.

Use of Thermoelectric Conversion Material Comprising Barrier Material in Third Embodiment, Fourth Embodiment and/or Fifth Embodiment The preferable method for using the thermoelectric conversion material 100 comprising the barrier material in the third embodiment, fourth embodiment and/or fifth embodiment is described.

Figure 9:
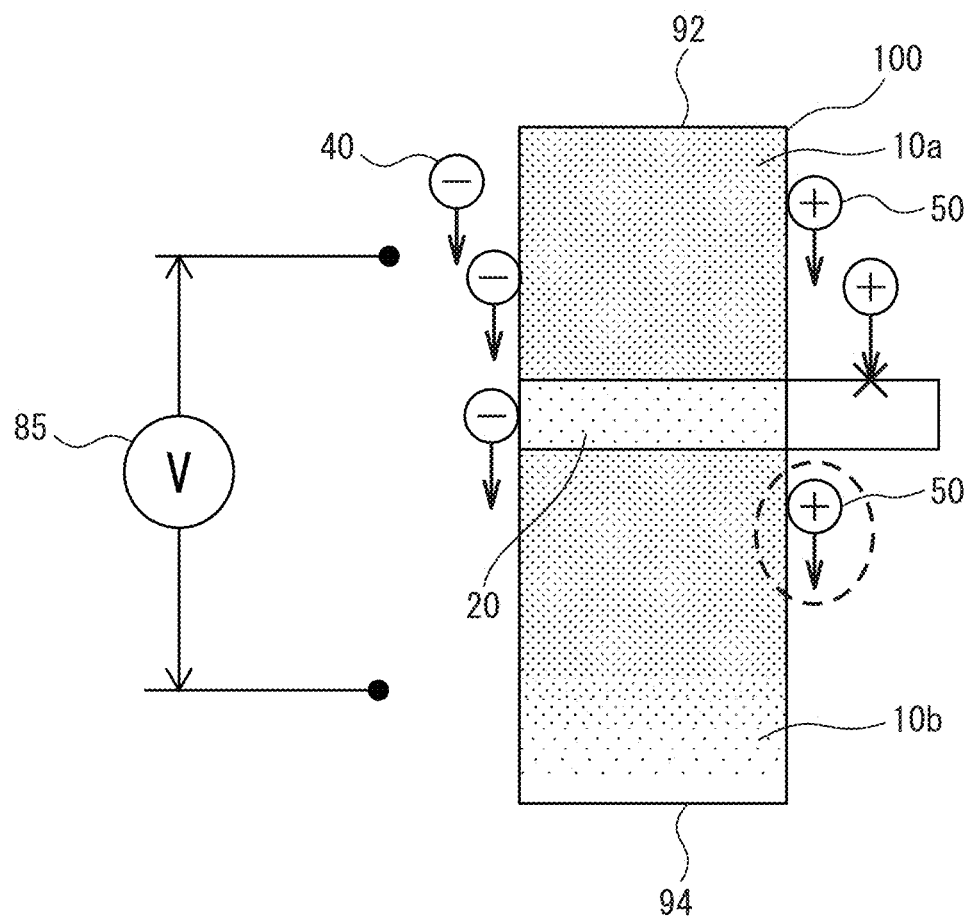
FIG. 9 is an explanatory diagram schematically illustrating the behavior of carrier when the temperature deference between both ends of the thermoelectric conversion material is 10° C.
Figure 10:
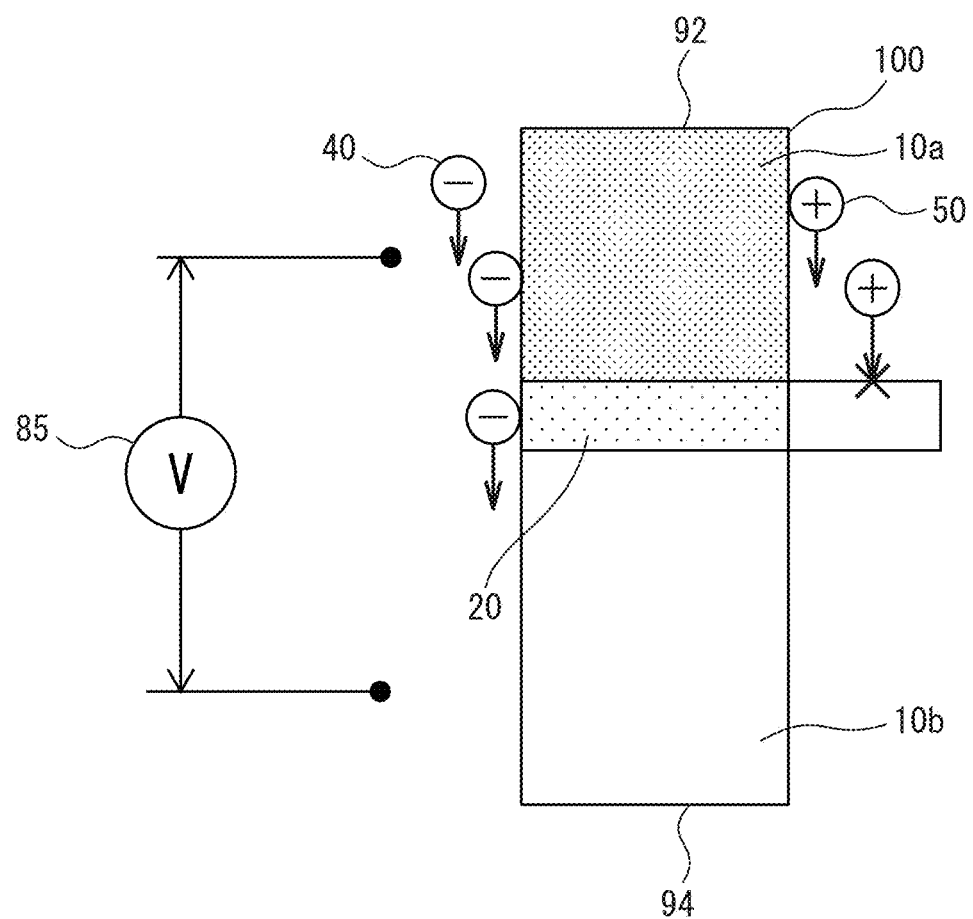
FIG. 10 is an explanatory diagram schematically illustrating the behavior of carrier when the temperature deference between both ends of the thermoelectric conversion material is 100° C.

FIG. 9 is an explanatory diagram schematically illustrating the behavior of carrier when the temperature deference between both ends of the thermoelectric conversion material 100 is 10 K. FIG. 10 is an explanatory diagram schematically illustrating the behavior of carrier when the temperature deference between both ends of the thermoelectric conversion material is 100 K.

The thermoelectric conversion materials 100 illustrated in both FIG. 9 and FIG. 10 are described by referring to a case where the temperature on the high temperature side 92 is set to 600 K. As for the thermoelectric conversion material 100 of FIG. 9, since the temperature difference between both ends is 10 K, the temperature on the low temperature side 94 is 590 K. On the other hand, as for the thermoelectric conversion material 100 of FIG. 10, since the temperature difference between both ends is 100 K, the temperature on the low temperature side 94 is 500 K.

In the thermoelectric conversion material 100 illustrated in FIG. 9, the temperature on the low temperature side 94 is 590 K, and therefore the temperature of the low-temperature-side matrix 10b exceeds 590 K. Accordingly, inside the low-temperature-side matrix 10b, as shown by the broken line circle of FIG. 9, a hole 50 as the minority carrier is likely to be generated, and the hole 50 transfers to the low temperature side 94 without being blocked by the barrier material 20. Consequently, as illustrated in FIG. 9, the thermoelectromotive force measured by a voltmeter 85 spanning across the barrier material 20 decreases extremely.

On the other hand, in the thermoelectric conversion material 100 illustrated in FIG. 10, the temperature on the low temperature side 94 is 500 K, and therefore the temperature of the low-temperature-side matrix 10b is low compared with the thermoelectric conversion material 100 illustrated in FIG. 9. Accordingly, in the thermoelectric conversion material 100 illustrated in FIG. 10, inside the low-temperature-side matrix 10b, a hole 50 as the minority carrier is hardly generated. Consequently, the thermoelectromotive force is difficult to decrease. This thermoelectromotive force can be measured by a voltmeter 85 spanning across the barrier material 20 as illustrated in FIG. 10.

As understood from these, in the thermoelectric conversion material 100 comprising the barrier material 20 in the third embodiment, fourth embodiment and/or fifth embodiment, the larger the temperature difference imparted between both ends of the thermoelectric conversion material 100 is, the higher the effect of blocking transfer of the hole 50 as the minority carrier is.

(Production Method of Thermoelectric Conversion Material)

The method for producing the thermoelectric conversion material of the present disclosure is described below. As long as the thermoelectric conversion material satisfies the configuration requirements described hereinbefore, the production method thereof is not particularly limited. The production method includes, for example, the following production method.

(Preparation of Matrix Alloy Ingot)

Raw materials containing Mg, Si, Sn and an n-type dopant are weighed. The raw materials are not particularly limited as long as a desired matrix alloy ingot is obtained. The raw materials are preferably an Mg powder, an Si powder, an Sn powder, and an n-type dopant powder. It may also possible to use an $Mg_2Si$ powder and an Sn powder. Powdering of each raw material facilitates alloying. The n-type dopant includes one or more members selected from Sb, Bi and Al.

Respective raw materials are weighed such that the matrix alloy ingot contains $Mg_2Si_{1-x}Sn_x$ (x is from 0.50 to 0.80) and an n-type dopant. The weighed raw materials are charged into a vessel, and first alloying heat treatment is carried out by heating the interior of the vessel. The interior of the vessel is preferably in an inert gas atmosphere so as to suppress oxidation of the raw material. The inert gas atmosphere includes a nitrogen gas atmosphere. In this way, a matrix alloy ingot is obtained.

The raw material of an n-type dopant may be weighed such that the n-type dopant content in the matrix alloy ingot becomes as follows. The n-type dopant content may be 0.001 at % or more, 0.010 at % or more, or 0.100 at % or more, relative to $Mg_2Si_{1-x}Sn_x$ (x is from 0.50 to 0.80). The n-type dopant content may also be 5.000 at % or less, 3.000 at % or less, or 1.000 at %, relative to $Mg_2Si_{1-x}Sn_x$ (x is from 0.50 to 0.80).

(Preparation of Barrier Material Alloy Ingot)

Raw materials containing Mg, Si and Sn are weighed. The raw materials are not particularly limited as long as a desired barrier material alloy ingot is obtained. The raw materials are preferably an Mg powder, an Si powder, and an Sn powder. It may also possible to use an $Mg_2Si$ powder and an Sn powder. Powdering of each raw material facilitates alloying.

Respective raw materials are weighed such that the barrier material alloy ingot contains $Mg_2Si_{1-x}Sn_x$ (x is from 0 to 0.30). The weighed raw materials are charged into a vessel, and second alloying heat treatment is carried out by heating the interior of the vessel. The interior of the vessel is preferably in an inert gas atmosphere so as to suppress oxidation of the raw material. The inert gas atmosphere includes a nitrogen gas atmosphere. In this way, a barrier material alloy ingot is obtained.

(Temperature of First Alloying Heat Treatment)

The temperature of the first alloying heat treatment is preferably from 600 to 750° C. Since the Sn content in the matrix is larger than that in the barrier material and the melting point of the matrix is lower than that of the barrier material, when the temperature of the first alloying heat treatment is 600° C. or more, Mg, Si and Sn are likely to be mutually diffused and at this time, the n-type dopant is also likely to be mutually diffused. In view of mutual diffusion of these elements, the temperature of the first alloying heat treatment is more preferably 650° C. or more, still more preferably 680° C. or more. On the other hand, when the temperature of the first alloying heat treatment is 750° C. or less, the raw material can be prevented from being wasted due to evaporation, etc. From the viewpoint of preventing the wasting of raw material, the temperature of the first alloying heat treatment is more preferably 720° C. or less.

(Time of First Alloying Heat Treatment)

The time of the first alloying heat treatment may be appropriately determined according to the particle diameter and amount of the raw material powder. The time of the first alloying heat treatment may be 6 hours or more, 8 hours or more, or 10 hours or more, and may be 18 hours or less, 16 hours or less, or 14 hours or less.

(Temperature of Second Alloying Heat Treatment)

The temperature of the second alloying heat treatment is preferably from 800 to 950° C. Since the Sn content in the barrier material is smaller than that in the matrix and the melting point of the barrier material is higher than that of the matrix, when the temperature of the second alloying heat treatment is 800° C. or more, Mg, Si and Sn are likely to be mutually diffused. In view of mutual diffusion of these elements, the temperature of the second alloying heat treatment is more preferably 850° C. or more, still more preferably 880° C. or more. On the other hand, when the temperature of the second alloying heat treatment is 950° C. or less, the raw material can be prevented from being wasted due to evaporation, etc. From the viewpoint of preventing the wasting of raw material, the temperature of the second alloying heat treatment is more preferably 920° C. or less.

(Time of Second Alloying Heat Treatment)

The time of the second alloying heat treatment may be appropriately determined according to the particle diameter and amount of the raw material powder. The time of the second alloying heat treatment may be 6 hours or more, 8 hours or more, or 10 hours or more, and may be 18 hours or less, 16 hours or less, or 14 hours or less.

(Crushing of Matrix Alloy Ingot)

The matrix alloy ingot obtained by the first alloying heat treatment is crushed to obtain a matrix alloy powder. The method for crushing is not limited. The method for crushing includes, for example, use of a mortar and pestle, a cutter mill, a ball mill, or a jet mill.

The particle diameter of the matrix alloy powder is preferably from 5 to 100 µm. When the particle diameter of the matrix alloy powder is 5 µm or more, the matrix alloy powder can be prevented from aggregating to make mixing with the barrier material alloy powder difficult. From the viewpoint of preventing aggregation, the particle diameter of the matrix alloy powder is more preferably 10 µm or more, still more preferably 40 µm or more, yet still more preferably 70 µm or more. On the other hand, when the particle diameter of the matrix alloy powder is 100 µm or less, occurrence of a hindrance to sintering can be suppressed. From the viewpoint of suppressing occurrence of a hindrance to sintering, the particle diameter of the matrix alloy powder is more preferably 90 µm or less, still more preferably 80 µm or less.

In the present description, unless otherwise indicated, the particle diameter means an equivalent-circle diameter, and when the particle diameter is described by referring to a range, 80% or more of all particles are distributed within the range.

(Crushing of Barrier Material Alloy Ingot)

The barrier material alloy ingot obtained by the second alloying heat treatment is crushed to obtain a barrier material alloy powder. The method for crushing is not limited. The method for crushing includes, for example, use of a mortar and pestle, a cutter mill, a ball mill, or a jet mill.

The particle diameter of the barrier material alloy powder is preferably from 5 to 50 µm. When the particle diameter of the barrier material alloy powder is 5 µm or more, the barrier material alloy powder can be prevented from aggregating to make mixing with the matrix alloy powder difficult. From the viewpoint of preventing aggregation, the particle diameter of the barrier material alloy powder is more preferably 10 µm or more, still more preferably 20 µm or more. On the other hand, when the particle diameter of the barrier material alloy powder is 50 µm or less, occurrence of a hindrance to sintering can be suppressed. From the viewpoint of suppressing occurrence of a hindrance to sintering, the particle diameter of the barrier material alloy powder is more preferably 40 µm or less.

In the case where the thermoelectric conversion material comprises the barrier material in the first embodiment and/or second embodiment, the particle diameter of the barrier material alloy powder is preferably smaller than the particle diameter of the matrix alloy powder. This makes it easy for the barrier material to be present in a grain boundary of the matrix or for the barrier material to disperse in the matrix.

(Preparation of Green Compact)

Figure 11:
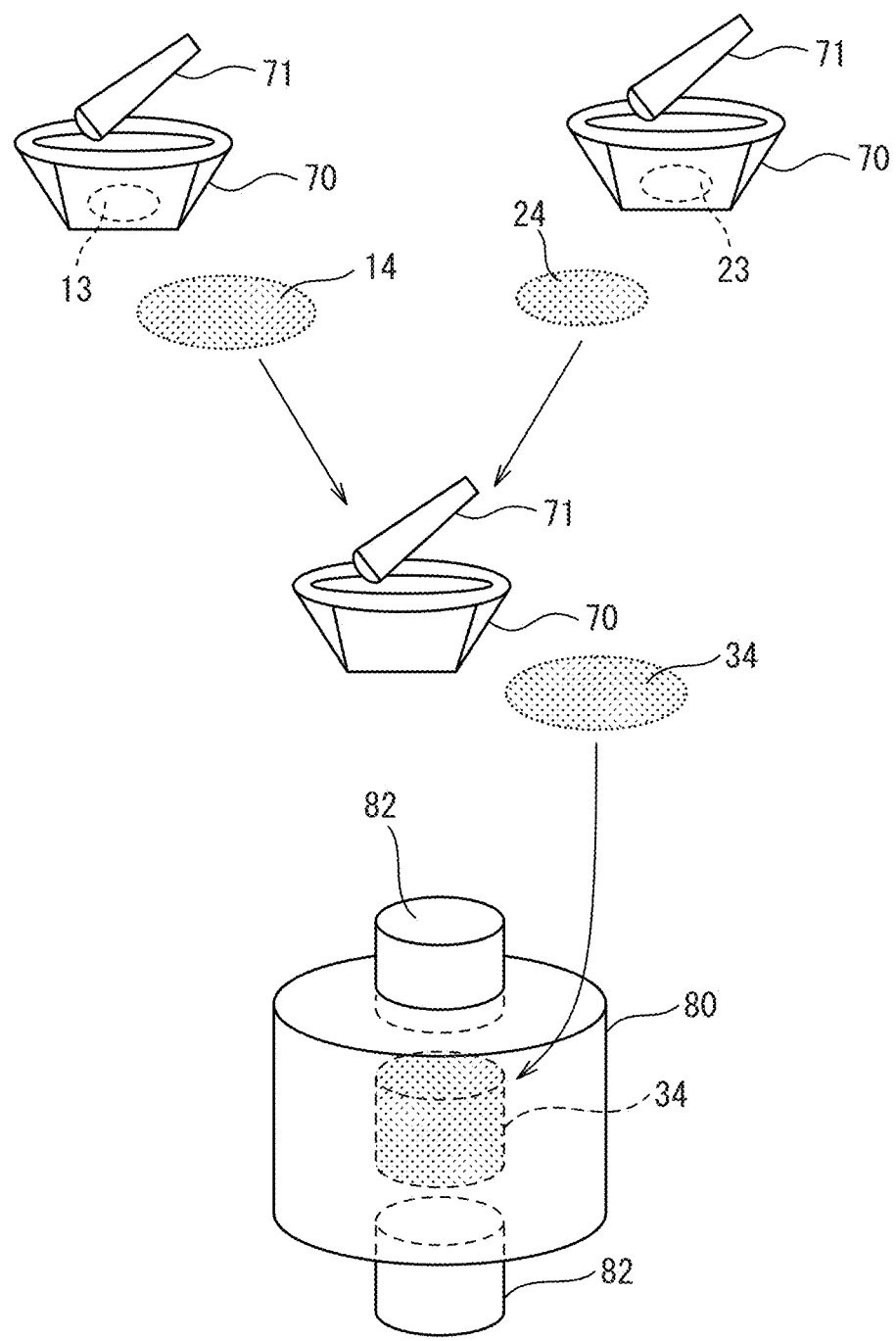
FIG. 11 is an explanatory diagram illustrating one example of the method for preparing a green compact such that the thermoelectric conversion material comprises the barrier material in the first embodiment and/or second embodiment.
Figure 12:
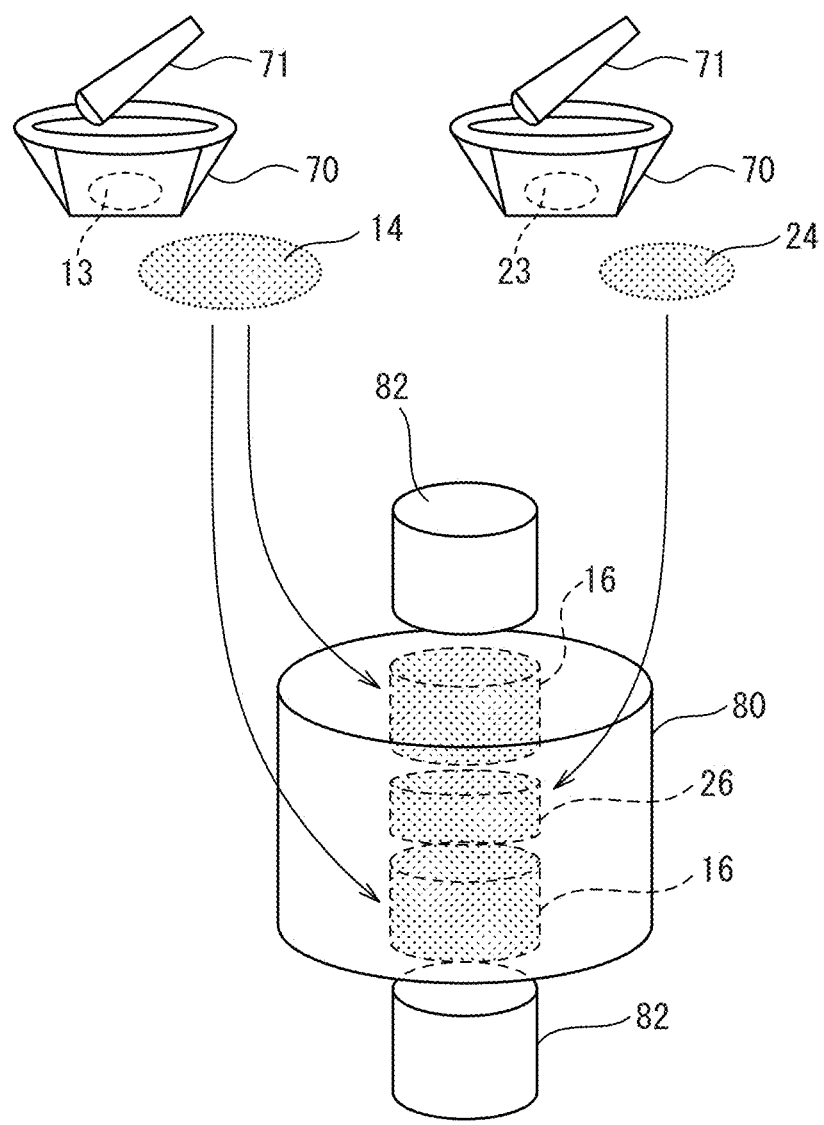
FIG. 12 is an explanatory diagram illustrating one example of the method for preparing a green compact such that the thermoelectric conversion material comprises the barrier material in the third embodiment.

A green compact is obtained using the matrix alloy powder and the barrier material alloy powder. FIG. 11 is an explanatory diagram illustrating one example of the method for preparing a green compact such that the thermoelectric conversion material comprises the barrier material in the first embodiment and/or second embodiment. FIG. 12 is an explanatory diagram illustrating one example of the method for preparing a green compact such that the thermoelectric conversion material comprises the barrier material in the third embodiment.

(Preparation of Green Compact by Mixing of Matrix Alloy Powder and Barrier Material Alloy Powder)

The method illustrated in FIG. 11 is described. A matrix alloy ingot 13 is crushed using a mortar 70 and a pestle 71 to obtain a matrix alloy powder 14. Similarly, a barrier material alloy ingot 23 is crushed using a mortar 70 and a pestle 71 to obtain a barrier material alloy powder 24. The matrix alloy powder 14 and the barrier material alloy powder 24 are charged into the mortar 70 and mixed using the pestle 71 to obtain a mixed powder 34. The mixed powder 34 is charged into a mold 80 and compacted using a punch 82 to obtain a green compact. A carbon sheet (not shown) is preferably provided on inner walls of the mold 80 and the punch 82 mold 80 before charging the mixed powder 34. The carbon sheet can prevent the mixed powder 34 from adhering to the inner wall of the mold 80 at the time of powder compacting.

As described above, the melting point of $Mg_2Si_{1-y}Sn_y$ (y is from 0 to 0.30) as the main component of the barrier material is higher than the melting point of $Mg_2Si_{1-x}Sn_x$ (x is from 0.50 to 0.80) as the main component of the matrix. Accordingly, when a green compact having mixed therein the matrix alloy powder and the barrier material alloy powder is sintered, at least part of the barrier material is present in a grain boundary of the matrix, or at least part of the barrier material disperses in the matrix. Due to the difference in the melting point between $Mg_2Si_{1-x}Sn_x$ and $Mg_2Si_{1-y}Sn_y$, it is difficult for $Mg_2Si_{1-x}Sn_x$ and $Mg_2Si_{1-y}Sn_y$ to be mutually diffused during sintering. The sintering method is described later.

The portion occupied by the barrier material alloy powder in the green compact preferably accounts for 5 to 20 vol % relative to the total volume of the green compact obtained by the method illustrated in FIG. 11. When such a green compact is sintered, from 5 to 20 vol % of the barrier material can be contained relative to the entire thermoelectric conversion material. That is, the proportion (vol %) of the barrier material alloy powder in the green compact relative to the total volume of the green compact corresponds to the proportion (vol %) of the barrier material relative to the entire thermoelectric conversion material.

In addition, when the portion occupied by the barrier material alloy powder in the green compact accounts for 5 to 20 vol %, the larger the proportion of the portion occupied by the barrier material alloy powder is, the more easily the barrier material is present in a grain boundary of the matrix in the thermoelectric conversion material after sintering.

In FIG. 11, an intermediate material alloy powder (not shown) may be mixed, in addition to the matrix alloy powder 14 and the barrier material alloy powder 24. That is, the mixed powder 34 may be obtained by mixing a matrix alloy powder 14, a barrier material alloy powder 24, and an intermediate material powder. A mixed powder 34 obtained in this way is charged into a mold 80 and compacted using a punch 82 to obtain a green compact. At this time, a carbon sheet is preferably provided in the same manner.

The intermediate material alloy powder is prepared as follows. Raw materials containing Mg, Si and Sn are weighed. The raw materials are not particularly limited as long as a desired intermediate material alloy ingot is obtained. The raw materials are preferably an Mg powder, an Si powder, and an Sn powder. It may also possible to use an $Mg_2Si$ powder and an Sn powder. Powdering of each raw material facilitates alloying.

Respective raw materials are weighed such that the intermediate material alloy ingot contains $Mg_2Si_{1-z}Sn_z$ (z is more than 0.30 and less than 0.50). The weighed raw materials are charged into a vessel, and third alloying heat treatment is carried out by heating the interior of the vessel. The interior of the vessel is preferably in an inert gas atmosphere so as to suppress oxidation of the raw material. The inert gas atmosphere includes a nitrogen gas atmosphere. In this way, an intermediate material alloy ingot is obtained.

The Sn content in the intermediate material is intermediate between the Sn content in the matrix and the Sn content in the barrier material, and therefore the melting point of the intermediate material is intermediate between the melting point of the matrix and the melting point of the barrier material. Accordingly, the temperature of the third alloying heat treatment is preferably set between the temperature of the first alloying heat treatment and the temperature of the second alloying heat temperature. Specifically, the temperature of the third alloying heat treatment is preferably from 700 to 850° C. When the temperature of the third alloying heat treatment is 700° C. or more, Mg, Si and Sn are likely to be mutually dispersed. In view of mutual diffusion of these elements, the temperature of the third alloying heat treatment is more preferably 750° C. or more, still more preferably 780° C. or more. On the other hand, when the temperature of the third alloying heat treatment is 850° C. or less, the raw material can be prevented from being wasted due to evaporation, etc. From the viewpoint of preventing the wasting of raw material, the temperature of the third alloying heat treatment is more preferably 820° C. or less.

The time of the third alloying heat treatment may be appropriately determined according to the particle diameter and amount of the raw material powder. The time of the third alloying heat treatment may be 6 hours or more, 8 hours or more, or 10 hours or more, and may be 18 hours or less, 16 hours or less, or 14 hours or less.

The intermediate material alloy ingot obtained by the third alloying heat treatment is crushed to obtain an intermediate material alloy powder. The method for crushing is not limited. The method for crushing includes, for example, use of a mortar and pestle, a cutter mill, a ball mill, or a jet mill.

The particle diameter of the intermediate material alloy powder is based on the particle diameter of the barrier material alloy powder. The particle diameter of the intermediate material alloy powder is preferably from 10 to 50 μm. When the particle diameter of the intermediate material alloy powder is 10 μm or more, the intermediate material alloy powder can be prevented from aggregating to make mixing with the matrix alloy powder and the barrier material alloy powder difficult. From the viewpoint of preventing aggregation, the particle diameter of the intermediate material alloy powder is more preferably 20 μm or more. On the other hand, when the particle diameter of the intermediate material alloy powder is 50 μm or less, occurrence of a hindrance to sintering can be suppressed. From the viewpoint of suppressing occurrence of a hindrance to sintering, the particle diameter of the intermediate material alloy powder is more preferably 40 μm or less.

The particle diameter of the intermediate material alloy powder is preferably smaller than the particle diameter of the matrix alloy powder. In this case, the intermediate material is likely to be present in a grain boundary of the matrix, or the intermediate material is readily dispersed in the matrix.

The amount of the intermediate material alloy powder may be 1 vol % or more, 2 vol % or more, 3 vol % or more, or 4 vol % or more, and may be 10 vol % or less, 9 vol % or less, 8 vol % or less, or 7 vol % or less, relative to all powders used.

(Preparation of Green Compact by Stacking of Matrix Alloy Powder and Barrier Material Alloy Powder)

The method illustrated in FIG. 12 is described. The matrix alloy ingot 13 is crushed using a mortar 70 and a pestle 71 to obtain a matrix alloy powder 14. Similarly, the barrier material alloy ingot 23 is crushed using a mortar 70 and a pestle 71 to obtain a barrier material alloy powder 24.

A punch 82 is provided at the bottom of a mold 80, and the matrix alloy powder 14 is charged from an upper opening of the mold 80 to deposit the matrix alloy powder 14 and form a matrix alloy powder layer 16. Then, the barrier material alloy powder 24 is charged from the upper opening of the mold 80 to deposit the barrier material alloy powder 24 above the matrix alloy powder layer 16 and form a barrier material alloy powder layer 26. Furthermore, the matrix alloy powder 14 is charged from the upper opening of the mold 80 to deposit the matrix alloy powder 14 and form a matrix alloy powder layer 16. In this way, the matrix alloy powder layer 16 and the barrier material alloy powder layer 26 are stacked while sandwiching the barrier material alloy powder layer 26 by the matrix alloy powder layers 16 to obtain a powder stack. This powder stack is compacted by using the punch 82 to obtain a green compact. A carbon sheet (not shown) is preferably provided on inner walls of the mold 80 before charging the matrix alloy powder 14 and the barrier material alloy powder 24. The carbon sheet can prevent the matrix alloy powder 14 and the barrier material alloy powder 24 from adhering to the inner wall of the mold 80 at the time of powder compacting.

As described above, the melting point of $Mg_2Si_{1-y}Sn_y$ (y is from 0 to 0.30) as the main component of the barrier material is higher than the melting point of $Mg_2Si_{1-x}Sn_x$ (x is from 0.50 to 0.80) as the main component of the matrix. Accordingly, when a green compact comprising a barrier material alloy powder layer sandwiched by matrix alloy powder layers is sintered, a stack comprising a barrier material sandwiched by matrices can be obtained. This is because due to the difference in the melting point between $Mg_2Si_{1-x}Sn_x$ and $Mg_2Si_{1-y}Sn_y$, it is difficult for $Mg_2Si_{1-x}Sn_x$ and $Mg_2Si_{1-y}Sn_y$ to be mutually diffused during sintering, and a stack having a clear boundary between the matrix and the barrier material is formed. The sintering method is described later.

In the example illustrated in FIG. 12, the powder stack comprising one barrier material alloy powder layer is depicted, but the powder stack is not limited thereto. A barrier material alloy powder layer 26 and a matrix alloy powder layer 16 may further be stacked above the stack of matrix alloy powder layer 16-barrier material alloy powder layer 26-matrix alloy powder layer 16 as illustrated in FIG. 12. More specifically, the powder stack may be a powder stack comprising a total of five layers in which a matrix alloy powder layer 16-*a* barrier material alloy powder layer 26-*a* matrix alloy powder layer 16-*a* barrier material alloy powder layer 26-*a* matrix alloy powder layer 16 are stacked in this order. This powder stack comprises two barrier material alloy powder layers 26.

In order for the thermoelectric conversion material to comprise the barrier material in the fourth embodiment, a powder stack is prepared as follows. As described above, the barrier material in the fourth embodiment is a barrier material at least one layer of which is formed in the second equal part from the high temperature side when the thermoelectric conversion material is divided into four equal parts in the stacking direction.

A powder stack is obtained by stacking the matrix alloy powder layer and the barrier material alloy powder layer such that when the stacking length of the powder stack is divided into four equal parts, at least one barrier material alloy powder layer is present in the second equal part from one end of the powder stack.

In FIG. 12, the powder stack may be obtained by further stacking an intermediate material alloy powder layer (not shown) between the matrix alloy powder layer 16 and the barrier material alloy powder layer 26. The thermoelectric conversion material thereby comprises the barrier material in the fifth embodiment. As described above, the barrier material in the fifth embodiment is a barrier material in which an intermediate material is further stacked between the matrix and at least one layer of the barrier material. The intermediate material contains $Mg_2Si_{1-z}Sn_z$ (z is more than 0.30 and less than 0.50).

An intermediate material alloy powder can be obtained in the same manner as in the case of obtaining a mixed power by mixing a matrix alloy powder, a barrier material alloy powder and an intermediate material powder. The thus-obtained intermediate material alloy powder is deposited to form an intermediate material alloy powder layer.

(Sintering of Green Compact)

As described in the foregoing pages, a green compact is prepared, and the green compact is sintered to obtain a sintered body. This sintered body is a thermoelectric conversion material satisfying the above-described configuration requirements.

The pressure sintering method follows the conventional method. The method includes, for example, Spark Plasma Sintering (SPS) etc.

The sintering pressure may be, for example, 10 MPa or more, 20 MPa or more, or 30 MPa or more, and may be 100 MPa or less, 80 MPa or less, 60 MPa or less, or 40 MPa or less.

The sintering temperature may be 600° C. or more, 640° C. or more, or 680° C. or more, and may be 800° C. or less, 780° C. or less, or 760° C. or less.

In order to obtain a thermoelectric conversion material comprising the barrier material in the third to fifth embodiments, the following conditions are preferably employed. The sintering temperature is preferably from 730 to 760° C. so as to impart strong bonding between the matrix and the barrier material, between the matrix and the intermediate material, or between the barrier material and the intermediate material. At the time of temperature drop, the temperature is preferably lowered at a rate of 0.1 to 10.0° C./min down to 400° C. so as to prevent occurrence of cracking near the interface. From this viewpoint, the temperature is more preferably lowered at a rate of 0.5 to 3.0° C./min down to 400° C.

The sintering time may be 10 minutes or more, or 15 minutes or more, and may be 120 minutes or less, 80 minutes or less, or 40 minutes or less. In order to obtain a thermoelectric conversion material comprising the barrier material in the third to fifth embodiments, the sintering time is preferably 30 minutes or more. The sintering atmosphere is preferably an inert gas atmosphere so as to prevent oxidation of the powder. The inert gas atmosphere includes a nitrogen gas atmosphere.

The thermoelectric conversion material of the present disclosure and the production method thereof are described more specifically below by referring to Examples. Incidentally, the thermoelectric conversion material of the present disclosure and the production method thereof are not limited to the conditions employed in the following Examples.

(Preparation of Sample)

Samples of Examples and Comparative Examples of the thermoelectric conversion material according to the present disclosure were prepared in the following manner.

Examples 1 to 4 and Comparative Examples 1 and 2

First, the method for preparing samples of Examples 1 to 4 and samples of Comparative Examples 1 and 2 to be compared therewith, comprising mixing a matrix alloy powder and a barrier material alloy powder as illustrated in FIG. 11, is described.

Example 1

An Mg powder, an Si powder and an Sn powder were weighted to afford a composition represented by $Mg_2Si_{0.30}Sn_{0.70}$. In addition, an Sb powder was weighed such that the Sb content becomes 0.70 at % relative to $Mg_2Si_{0.30}Sn_{0.70}$. These powders were mixed, and the mixed powder was subjected to first alloying heat treatment to obtain a matrix alloy ingot. The conditions of the first alloying heat treatment were a temperature of 700° C. and a time of 12 hours.

An Mg powder, an Si powder and an Sn powder were weighted to afford a composition represented by $Mg_2Si$ and mixed, and the mixed powder was subjected to second alloying heat treatment to obtain a barrier material alloy ingot A. In addition, an Mg powder, an Si powder and an Sn powder were weighted to afford a composition represented by $Mg_2Si_{0.8}Sn_{0.2}$ and mixed, and the mixed powder was subjected to second alloying heat treatment to obtain a barrier material alloy ingot B. The conditions of the second alloying heat treatment were, in both cases of barrier material alloy ingots A and B, a temperature of 900° C. and a time of 12 hours.

A green compact was obtained in the manner illustrated in FIG. 11. The particle diameter of the matrix alloy powder was from 10 to 75 μm. The particle diameter was from 5 to 30 μm in both the barrier material alloy powders A and B. A mixed powder was obtained by blending the matrix alloy powder and the barrier material alloy powders A and B such that the content of the barrier material becomes 10 vol % relative to the entire thermoelectric conversion material. In other words, the barrier material alloy powders A and B were blended in an amount of 10 vol % relative to the total of the matrix alloy powder and the barrier material alloy powders A and B.

The thus-obtained green compact was sintered. As for the sintering conditions, sintering was carried out at 700° C. over 30 minutes by spark plasma sintering. The sintered body obtained in this way was used as the sample of Example 1.

Example 2

The sample of Example 2 was prepared in the same manner as in Example 1 except that the barrier material alloy ingot was only the barrier material alloy ingot A. As for the blending ratio of the barrier material alloy powder A, 10 vol % of the barrier material alloy powder A was blended relative to the total of the matrix alloy powder and the barrier material alloy powder A.

Example 3

The sample of Example 3 was prepared in the same manner as in Example 1 except that the barrier material alloy ingot was only the barrier material alloy ingot B and the barrier material alloy powder B was obtained by weighing an Mg powder, an Si powder and an Sn powder to afford a composition represented by $Mg_2Si_{0.85}Sn_{0.15}$. As for the blending ratio of the barrier material alloy powder B, 10 vol % of the barrier material alloy powder B was blended relative to the total of the matrix alloy powder and the barrier material alloy powder B.

Example 4

The sample of Example 4 was prepared in the same manner as in Example 1 except that 5 vol % of the barrier material alloy powders A and B was blended relative to the total of the matrix alloy powder and the barrier material alloy powders A and B.

Comparative Example 1

The sample of Comparative Example 1 was prepared in the same manner as in Example 1 except that the barrier material alloy ingot was only the barrier material alloy ingot B and the barrier material alloy powder B was obtained by weighing an Mg powder, an Si powder and an Sn powder to afford a composition represented by $Mg_2Si_{0.60}Sn_{0.40}$. As for the blending ratio of the barrier material alloy powder B, 10 vol % of the barrier material alloy powder B was blended relative to the total of the matrix alloy powder and the barrier material alloy powder B.

Comparative Example 2

The sample of Comparative Example 2 was prepared in the same manner as in Example 1 except that only the matrix alloy ingot was prepared and the barrier material alloy ingot was not prepared.

Examples 5 to 7 and Comparative Examples 3 and 4

First, the method for preparing samples of Examples 5 to 7 and samples of Comparative Examples 3 and 4 to be compared therewith, comprising stacking a matrix alloy powder layer and a barrier material alloy powder layer as illustrated in FIG. 12, is described.

Example 5

An Mg powder, an Si powder and an Sn powder were weighted to afford a composition represented by $Mg_2Si_{0.30}Sn_{0.70}$. In addition, an Sb powder was weighed such that the Sb content becomes 0.20 at % relative to $Mg_2Si_{0.30}Sn_{0.70}$. These powders were mixed, and the mixed powder was subjected to first alloying heat treatment to obtain a matrix alloy ingot. The conditions of the first alloying heat treatment were a temperature of 700° C. and a time of 12 hours.

An Mg powder and an Si powder were weighted to afford a composition represented by $Mg_2Si$ and mixed, and the mixed powder was subjected to second alloying heat treatment to obtain a barrier material alloy ingot. The conditions of the second alloying heat treatment were a temperature of 900° C. and a time of 12 hours.

A green compact was obtained in the manner illustrated in FIG. 12. The particle diameter of the matrix alloy powder was from 10 to 75 μm. The particle diameter of the barrier material alloy powder was from 5 to 30 μm. A barrier material alloy mixed powder layer was disposed at ⅜ from the high temperature side to form a barrier material in the second equal part. As for the amounts used of the matrix alloy powder and the barrier material alloy powder, 5 vol % of the barrier material alloy powder was used relative to the total amount used of the matrix alloy powder and the barrier material alloy powder.

The thus-obtained green compact was sintered. As for the sintering conditions, sintering was carried out at 750° C. over 30 minutes by spark plasma sintering. The temperature was raised at a rate of 1.0° C./min up to 400° C. The sintered body obtained in this way was used as the sample of Example 5.

Example 6

The sample of Example 6 was prepared in the same manner as in Example 5 except that the barrier material alloy ingot was obtained by weighing an Mg powder, an Si powder and an Sn powder to afford a composition represented by $Mg_2Si_{0.85}Sn_{0.15}$.

Example 7

The sample of Example 7 was prepared in the same manner as in Example 5 except that the barrier material alloy ingot was obtained by weighing an Mg powder and an Si powder to afford a composition represented by $Mg_2Si$ and the barrier material alloy powder layer was disposed at ⅝ from the high temperature side to form a barrier material in the third equal part.

Comparative Example 3

The sample of Comparative Example 3 was prepared in the same manner as in Example 5 except that only the matrix alloy ingot was prepared and the barrier material alloy ingot was not prepared.

Comparative Example 4

The sample of Comparative Example 4 was prepared in the same manner as in Example 5 except that the barrier material alloy ingot was obtained by weighing an Mg powder, an Si powder and an Sn powder to afford a composition represented by $Mg_2Si_{0.50}Sn_{0.50}$.

(Evaluation)

With respect to each of the samples of Examples and Comparative Examples, the thermoelectromotive force and the electrical resistivity were measured, and PF (power factor) was calculated from the thermoelectromotive force and the electrical resistivity. The measurement methods and calculation method thereof are described below.

(Measurement Method of Thermoelectromotive Force)

The method for measuring the thermoelectromotive force (μV/K) is described. A copper block was put into contact with both ends of the sample, and the entirety was heated to the measurement temperature. Both ends of the sample indicate the end part on the high temperature side and the end part on the low temperature side.

As to the samples of Examples 1 to 4 and Comparative Examples 1 and 2, a temperature difference of 10 K was created between the copper block on the high temperature side and the copper block on the low temperature side, and the voltage at which the current becomes zero was measured between two points near the center of the high temperature side and the low temperature side. The absolute value of the thermoelectromotive force was calculated from the measured voltage value. This measurement method is the same as the general measurement method for the Seebeck coefficient of a thermoelectric conversion material.

As to Example 1, Example 4 and Comparative Example 2, a temperature difference of 10 K was created between the copper block on the high temperature side and the copper block on the low temperature side by changing the temperature on the high temperature side in the range from 273 to 673 K, and the thermoelectromotive force was measured in the same manner.

As to the samples of Examples 5 to 7 and Comparative Examples 3 and 4, a temperature difference of 100 K or more was created between the copper block on the high temperature side and the copper block on the low temperature side, and the voltage at which the current becomes zero was measured between two points sandwiching the barrier material. The absolute value of the thermoelectromotive force was calculated from the measured voltage value. This measurement method is different from the general measurement method for the Seebeck coefficient of a thermoelectric conversion material, but the thermoelectromotive force value obtained by this measurement method is substantially equal to the Seebeck coefficient.

(Measurement Method of Electrical Resistivity)

The electrical resistance value was measured at both ends of the sample, and the electrical resistivity was calculated by dividing the measured value by the distance between both ends of the sample.

(Calculation Method of PF (Power Factor))

PF was calculated using formula (C) described above. In formula (C), the thermoelectromotive force was assigned to the Seebeck coefficient, and the reciprocal of the electrical resistivity was assigned to the electrical conductivity.

(Microtexture Observation)

As to the sample of Example 2, texture observation was carried out using Scanning Electron Microscope (SEM). In addition, area analysis (mapping) for Si element was carried out by Energy Dispersive X-ray Spectroscopy (EDX).

(X-Ray Diffraction Analysis)

X-Ray Diffraction (XRD) in the vicinity of the barrier material was carried out on the sample of Example 5.

(Evaluation Results)

Figure 13:
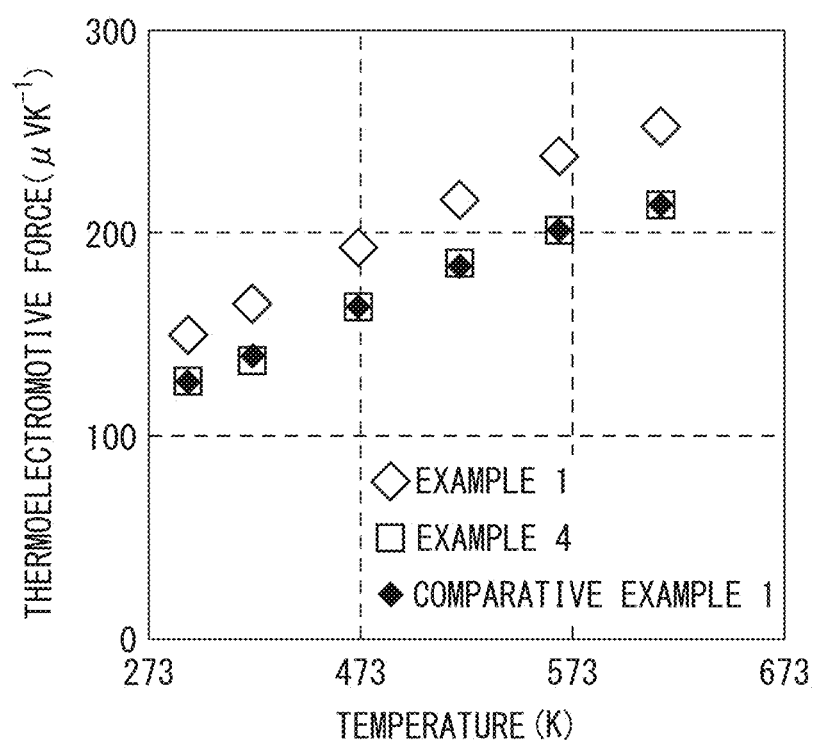
FIG. 13 is a graph illustrating the relationship between the temperature and the thermoelectromotive force regarding the samples of Example 1, Example 4 and Comparative Example 2.

Relating to Examples 1 to 4 and Comparative Examples 1 and 2, the measurement results of thermoelectromotive force and electrical resistivity and the calculation results of PF are shown in Table 1. In Table 1, the compositions of the matrix and the barrier material, the condition of the barrier material, the content of the barrier material relative to the entire thermoelectric conversion material, and the temperatures on high temperature side and low temperature side at the time of measurement of thermoelectromotive force are also shown. In addition, FIG. 13 illustrates the relationship between the temperature and the thermoelectromotive force regarding Example 1, Example 4 and Comparative Example 1.

Relating to Examples 5 to 7 and comparative Examples 3 and 4, the measurement results of thermoelectromotive force and electrical resistivity of and the calculation results of PF are shown in Table 2. In Table 2, the compositions of the matrix and the barrier material, the forming position of the barrier material, the content of the barrier material relative to the entire thermoelectric conversion material, the thickness of the barrier material, and the temperatures on high temperature side and low temperature side at the time of measurement of thermoelectromotive force are shown together. Furthermore, in Table 2, the temperatures on high temperature side and low temperature side at the time of measurement of thermoelectromotive force as well as the thermoelectromotive force, when the temperature difference between both ends of the thermoelectric conversion material is 10 K, are also shown.

Figure 14:
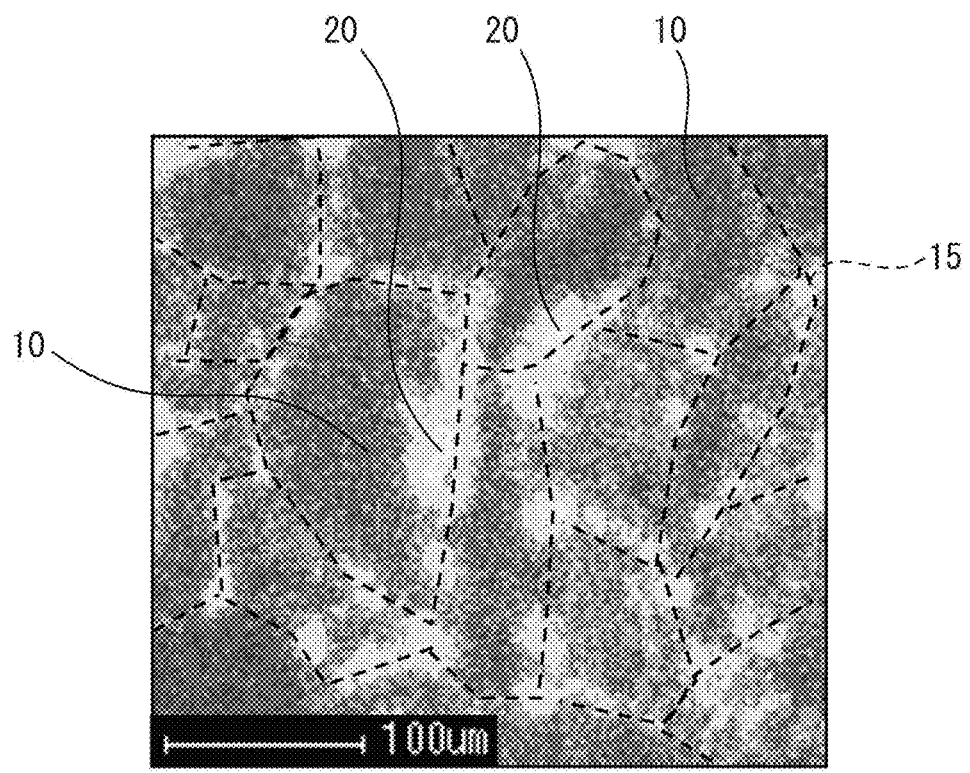
FIG. 14 is a diagram illustrating the results of surface analysis for Si element on the sample of Example 2.
Figure 15:
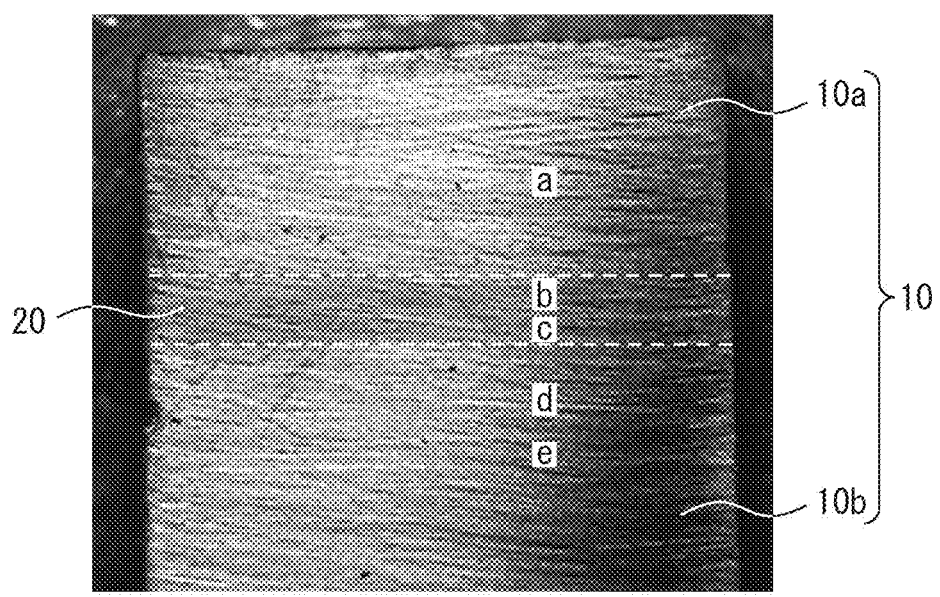
FIG. 15 is a diagram illustrating the position where X-ray diffraction analysis is carried out on the sample of Example 5.
Figure 16:
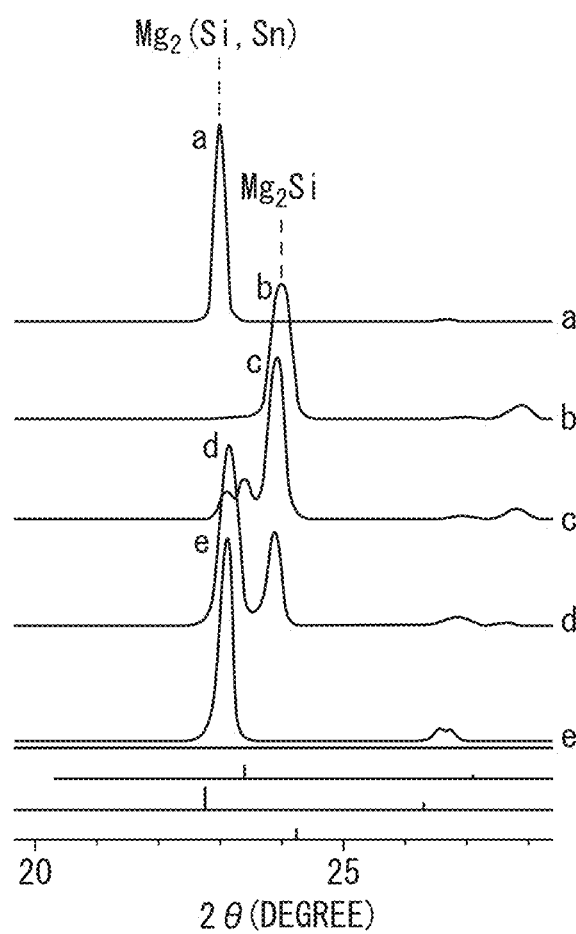
FIG. 16 is a diagram illustrating the results when X-ray diffraction analysis is carried out on the sample of Example 5.

FIG. 14 illustrates the results of area analysis (mapping) for Si element on the sample of Example 2. FIG. 15 illustrates the position where X-ray diffraction analysis is carried out on the sample of Example 5. In addition, FIG. 16 illustrates the results obtained.

TABLE 1

| | Composition of Matrix | Barrier Material Composition | Barrier Material Condition | Barrier Material Content (vol %) | Temperature on High Temperature Side (K) | Temperature on Low Temperature Side (K) | Thermo-electromotive Force (μV/K) | Electrical Resistivity (μΩm) | PF (mWm$^{-1}$K$^{-2}$) |
|---|---|---|---|---|---|---|---|---|---|
| Example 1 | $Mg_2(Si_{0.30}Sn_{0.70})$ + Sb 0.70% | $Mg_2Si$, $Mg_2(Si_{0.80}Sn_{0.20})$ | present in grain boundary of matrix | 10 | 580 | 570 | 216 | 10 | 4.6 |
| Example 2 | $Mg_2(Si_{0.30}Sn_{0.70})$ + Sb 0.7% | $Mg_2Si$ | dispersed in matrix | 10 | 580 | 570 | 214 | 12 | 3.8 |
| Example 3 | $Mg_2(Si_{0.30}Sn_{0.70})$ + Sb 0.70% | $Mg_2(Si_{0.85}Sn_{0.15})$ | dispersed in matrix | 10 | 580 | 570 | 201 | 10 | 4.0 |
| Example 4 | $Mg_2(Si_{0.30}Sn_{0.70})$ + Sb 0.70% | $Mg_2Si$, $Mg_2(Si_{0.80}Sn_{0.20})$ | present in grain boundary of matrix | 5 | 580 | 570 | 184 | 10 | 3.5 |
| Comparative Example 1 | $Mg_2(Si_{0.30}Sn_{0.70})$ + Sb 0.70% | $Mg_2(Si_{0.60}Sn_{0.40})$ | dispersed in matrix | 10 | 580 | 570 | 174 | 10 | 3.1 |
| Comparative Example 2 | $Mg_2(Si_{0.30}Sn_{0.70})$ + Sb 0.70% | — | — | — | 580 | 570 | 183 | 10 | 3.4 |

TABLE 2

| | Matrix | Barrier Material | Barrier Material Forming Position | Barrier Material Content (vol %) | Thickness of Barrier Material (μm) |
|---|---|---|---|---|---|
| Example 5 | $Mg_2(Si_{0.30}Sn_{0.70})$ + Sb 0.20% | $Mg_2Si$ | second equal part (3/8 from high temperature side) | 5 | 300 |
| Example 6 | $Mg_2(Si_{0.30}Sn_{0.70})$ + Sb 0.20% | $Mg_2(Si_{0.85}Sn_{0.15})$ | second equal part (3/8 from high temperature side) | 5 | 300 |
| Example 7 | $Mg_2(Si_{0.30}Sn_{0.70})$ + Sb 0.20% | $Mg_2Si$ | third equal part (5/8 from high temperature side) | 5 | 300 |
| Comparative Example 3 | $Mg_2(Si_{0.30}Sn_{0.70})$ + Sb 0.20% | — | — | — | — |
| Comparative Example 4 | $Mg_2(Si_{0.30}Sn_{0.70})$ + Sb 0.20% | $Mg_2(Si_{0.50}Sn_{0.50})$ | second equal part (3/8 from high temperature side) | 5 | 300 |

| | Temperature on High Temperature Side (K) | Temperature on Low Temperature Side (K) | Thermo-electromotive Force (μVK$^{-1}$) | Electrical Resistivity (μΩm) | PF (mWm$^{-1}$K$^{-2}$) | Temperature on High Temperature Side (K) | Temperature on Low Temperature Side (K) | Thermo-electromotive Force (μVK$^{-1}$) |
|---|---|---|---|---|---|---|---|---|
| Example 5 | 602 | 444 | 372 | 37 | 3.7 | 615 | 605 | 315 |
| Example 6 | 616 | 468 | 341 | 32 | 3.6 | — | — | — |
| Example 7 | 599 | 448 | 311 | 37 | 2.6 | — | — | — |
| Comparative Example 3 | 613 | 457 | 300 | 33 | 2.7 | 611 | 601 | 302 |
| Comparative Example 4 | 618 | 454 | 295 | 35 | 2.5 | — | — | — |

As understood from Table 1, it could be confirmed that in the thermoelectric conversion materials of Examples 1 to 3, the thermoelectromotive force and PF are larger than those of the thermoelectric conversion materials of Comparative Examples 1 to 2 and the thermoelectric performance of the thermoelectric conversion materials of the present disclosure are excellent. In addition, as seen from FIG. 13, even when the temperature on the high temperature side is changed, the thermoelectromotive force of the thermoelectric conversion materials of Examples 1 and 4 is larger than that of the thermoelectric conversion material of Comparative Example 2.

More particularly, it is seen from Table 1 and FIG. 13 that the thermoelectromotive force of the thermoelectric conversion material of Example 4 is slightly larger than that of the thermoelectric conversion material of Comparative Example 2. On the other hand, it is seen from Table 1 that the thermoelectromotive force of the thermoelectric conversion material of Example 4 is sufficiently larger than that of the thermoelectric conversion material of Comparative Example 1. Also from these facts, it could be confirmed that even when the barrier material content is small and 5 vol % as in the thermoelectric conversion material of Example 4, the effect of the thermoelectric conversion material of the present invention is adequately provided compared to the case of comprising a barrier material having a large Sn content as in Comparative Example 1.

As understood from Table 2, it could be confirmed that the thermoelectromotive force of the thermoelectric conversion materials of Examples 5 to 7 is larger than that of the thermoelectric conversion materials of Comparative Examples 3 and 4. Furthermore, it could be confirmed that the thermoelectric performance of the thermoelectric conversion material of the present disclosure is further enhanced since PF of the thermoelectric conversion materials of Examples 5 and 6 is larger than that of the thermoelectric conversion materials of Comparative Examples 3 and 4, and in thermoelectric conversion materials of Examples 5 and 6 the barrier material is present in the second equal part.

In FIG. 15, the regions denoted by b and c correspond to the regions where the barrier material alloy powder layer is disposed in the green compact. As seen from FIG. 16, in the regions denoted by b and c, a peak of $Mg_2Si$ is observed. In the thermoelectric conversion material of Example 5, $Mg_2Si$ is the main component of the barrier material. It could be confirmed therefrom that the thermoelectric conversion material of Example 5 has a structure in which the barrier material is sandwiched by the matrices and the matrices and the barrier material are stacked.

These results verify that the thermoelectric conversion material of the present disclosure and the production method thereof provide remarkable effects.

DESCRIPTION OF NUMERICAL REFERENCES

10 Matrix
10a High-temperature-side matrix
10b Lowe-temperature-side matrix
13 Matrix alloy ingot
14 Matrix alloy powder
15 Grain boundary
16 Matrix alloy powder layer
20 Barrier material
22 Intermediate material
22a High-temperature-side intermediate material
22b Low-temperature-side intermediate material
23 Barrier material alloy ingot
24 Barrier material alloy powder
26 Barrier material alloy powder layer
30a High-temperature-side interface
30b Low-temperature-side interface
34 Mixed powder
40 Electron
50 Hole
70 Mortar
71 Pestle
80 Mold
82 Punch
85 Voltmeter
92 High temperature side
94 Low temperature side
100 Thermoelectric conversion material

The invention claimed is:

1. A thermoelectric conversion material comprising a matrix and a barrier material, wherein:
the matrix contains $Mg_2Si_{1-x}Sn_x$ (x is from 0.50 to 0.80) and an n-type dopant,
the barrier material contains $Mg_2Si_{1-y}Sn_y$ (y is from 0 to 0.30),
the matrix is divided into a high-temperature-side matrix and a low-temperature-side matrix by the barrier material,
a high-temperature-side interface is present between the high-temperature-side matrix and the barrier material,
a low-temperature-side interface is present between the barrier material and the low-temperature-side matrix,
a band offset ΔEc is formed on a conduction band side in the high-temperature-side interface and the low-temperature-side interface,
a band offset ΔEv is formed on a valence band side in the high-temperature-side interface and the low-temperature-side interface, and
the band offset ΔEc is 0.1 eV or less and the band offset ΔEv is 0.10 eV or more.

2. The thermoelectric conversion material according to claim 1, wherein the n-type dopant is one or more members selected from Sb, Bi and Al.

3. The thermoelectric conversion material according to claim 1, wherein at least part of the barrier material is present in a grain boundary of the matrix.

4. The thermoelectric conversion material according to claim 1, wherein at least part of the barrier material is dispersed in the matrix.

5. The thermoelectric conversion material according to claim 3, comprising from 5 to 20 vol % of the barrier material relative to the entire thermoelectric conversion material.

6. The thermoelectric conversion material according to claim 3, wherein:
the thermoelectric conversion material further comprises an intermediate material, and
the intermediate material contains $Mg_2Si_{1-z}Sn_z$ (z is more than 0.30 and less than 0.50).

7. The thermoelectric conversion material according to claim 6, wherein at least part of the intermediate material is present in a grain boundary of the matrix.

8. The thermoelectric conversion material according to claim 6, wherein at least part of the intermediate material is dispersed in the matrix.

9. The thermoelectric conversion material according to claim 1, wherein:
the barrier material and the matrix are stacked to sandwich the barrier material between the matrices, and
the barrier material is formed as one layer or as two or more layers.

10. The thermoelectric conversion material according to claim 9, wherein:
one end in the stacking direction of the thermoelectric conversion material is a high temperature side,
another end in the stacking direction of the thermoelectric conversion material is a low temperature side, and
when the thermoelectric conversion material is divided into four equal parts in the stacking direction, at least one layer of the barrier material is formed in the second equal part from the high temperature side.

11. The thermoelectric conversion material according to claim 9, wherein:
an intermediate material is further stacked between the matrix and at least one layer of the barrier material, and
the intermediate material contains $Mg_2Si_{1-z}Sn_z$ (z is more than 0.30 and less than 0.50).

12. A method for producing the thermoelectric conversion material according to claim 1, comprising:
after weighing raw materials containing Mg, Si, Sn and an n-type dopant, subjecting them to first alloying heat treatment to obtain a matrix alloy ingot, after weighing raw materials containing Mg, Si and Sn, subjecting them to second alloying heat treatment to obtain a barrier material alloy ingot, crushing the matrix alloy ingot to obtain a matrix alloy powder, crushing the barrier material alloy ingot to obtain a barrier material alloy powder, obtaining a green compact containing the matrix alloy powder and the barrier material alloy powder, and sintering the green compact to obtain a sintered body, wherein:

the matrix alloy ingot contains $Mg_2Si_{1-x}Sn_x$ (x is from 0.50 to 0.80) and an n-type dopant, and the barrier material alloy ingot contains $Mg_2Si_{1-y}Sn_y$ (y is from 0 to 0.30).

13. The method according to claim 12, wherein the n-type dopant is one or more members selected from Sb, Bi and Al.

14. The method according to claim 12, wherein the temperature of the first alloying heat treatment is from 600 to 750° C.

15. The method according to claim 12, wherein the temperature of the second alloying heat treatment is from 800 to 950° C.

16. The method according to claim 12, comprising:
mixing the matrix alloy powder and the barrier material alloy powder to obtain a mixed powder, and
compacting the mixed powder to obtain a green compact.

17. The method according to claim 16, wherein the portion occupied by the barrier material alloy powder accounts for 5 to 20 vol % relative to the entire volume of the green compact.

18. The method according to claim 16, comprising:
after weighing raw materials containing Mg, Si and Sn, subjecting them to third alloying heat treatment to obtain an intermediate material alloy ingot,
crushing the intermediate material alloy ingot to obtain an intermediate material alloy powder,
mixing the matrix alloy powder, the barrier material alloy powder, and the intermediate material alloy powder to obtain a mixed powder, and
compacting the mixed powder to obtain a green compact, wherein:
the intermediate material alloy ingot contains $Mg_2Si_{1-z}Sn_z$ (z is more than 0.30 and less than 0.50).

19. The method according to claim 12, comprising:
depositing the matrix alloy powder to form a matrix alloy powder layer,
depositing the barrier material alloy powder to form a barrier material alloy powder layer,
stacking the matrix alloy powder layer and the barrier material alloy powder layer while sandwiching the barrier material alloy powder layer by the matrix alloy powder layers to obtain a powder stack having one layer or two or more layers of the barrier material alloy powder layer, and
compacting the powder stack to obtain a green compact.

20. The method according to claim 19, wherein the powder stack is obtained by stacking the matrix alloy powder layer and the barrier material alloy powder layer such that when the stacking length of the powder stack is divided into four equal parts, at least one barrier material alloy powder layer is present in the second equal part from one end of the powder stack.

21. The method according to claim 19, comprising:
after weighing raw material powders containing Mg, Si and Sn, subjecting them to third alloying heat treatment to obtain an intermediate material alloy ingot,
crushing the intermediate material alloy ingot to obtain an intermediate material alloy powder,
depositing the intermediate material alloy powder to form an intermediate material alloy powder layer, and
further stacking the intermediate material alloy powder layer between the matrix alloy powder layer and the barrier material to obtain a powder stack.

* * * * *